US006847210B1

(12) United States Patent
Eydelman et al.

(10) Patent No.: US 6,847,210 B1
(45) Date of Patent: Jan. 25, 2005

(54) MRI ANTENNA

(75) Inventors: Gregory Eydelman, West Hempstead, NY (US); Raymond V. Damadian, Woodbury, NY (US); Anthony J. Giambalvo, Kings Park, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/738,235

(22) Filed: Dec. 15, 2000

Related U.S. Application Data

(60) Provisional application No. 60/172,199, filed on Dec. 17, 1999.

(51) Int. Cl.[7] ................................................. G01V 3/00
(52) U.S. Cl. ....................................... 324/318; 324/322
(58) Field of Search ............................... 324/307, 309, 324/318, 320, 322, 303, 302

(56) References Cited

U.S. PATENT DOCUMENTS

| | | |
|---|---|---|
| 3,902,177 A | 8/1975 | Mori et al. |
| 4,083,006 A | 4/1978 | Yokoshima |
| 4,373,163 A | 2/1983 | Vandebult |
| 4,605,899 A | 8/1986 | Eumurian et al. |
| 4,725,781 A | 2/1988 | Roschmann |
| 4,775,837 A | 10/1988 | Roschmann |
| 4,816,766 A | 3/1989 | Zabel et al. |
| 4,820,985 A | 4/1989 | Eash |
| 4,833,409 A | 5/1989 | Eash |
| 4,835,472 A | 5/1989 | Zabel et al. |
| 4,839,594 A | 6/1989 | Misic et al. |
| 4,859,950 A | 8/1989 | Keren |
| 4,887,038 A | 12/1989 | Votruba et al. |
| 4,922,204 A | 5/1990 | Duerr et al. |
| 5,006,805 A | 4/1991 | Ingwersen |
| 5,050,605 A | 9/1991 | Eydelman et al. |
| 5,184,076 A | 2/1993 | Ehnholm |
| 5,363,113 A | 11/1994 | Mametsa et al. |

(List continued on next page.)

OTHER PUBLICATIONS

Gary X. Shen, et al., "Experimentally Verified, Theoretical Design of Dual–Tuned, Low–Pass Birdcage Radiofrequency Resonators for Magnetic Resonance Imaging and Magnetic Resonance Spectroscopy of Human Brain at 3.0 Tesla", Magnetic Resonance In Medicine, vol. 41, No. 2, pp. 268–275, 1999.

P. Elies et al., "Analytical Optimization of the Torque of a Permanent–Magnet Coaxial Synchronous Coupling", IEEE Transactions on Magnetics, vol. 34, No. 4, pp. 2267–2273, Jul., 1998.

(List continued on next page.)

*Primary Examiner*—Christopher W. Fulton
*Assistant Examiner*—Dixomara Vargas
(74) *Attorney, Agent, or Firm*—Brandon N. Sklar; Kaye Scholer, LLP

(57) ABSTRACT

Antennas for use in magnetic resonance imaging ("MRI") comprise a coaxial cable unit having an inner conductor tuned to a frequency, typically the Larmor frequency of the species of interest, and an outer conductor substantially surrounding the inner conductor and also tuned to the frequency. The inner and outer conductors are inductively coupled. The antennas may be used as receiving and transmitting antennas. In a receiving antenna, the inner conductor provides an output of the antenna. In a transmitting antenna, an input is provided to the inner conductor. Antenna arrays of one or more coaxial cable units, wherein the inner conductors of each unit are electrically connected and the outer conductors are electrically connected, and the units are inductively coupled, may be provided. Additional coaxial cable units may also be provided, inductively coupled to adjacent coaxial cable units. Each coaxial cable unit may comprise multiple inner conductors. A second outer conductor may be provided substantially surrounding the first outer conductor, tuned to the frequency and including holes through the second outer conductor. A hand, wrist and toe antenna array and a head antenna array are disclosed. Magnetic resonance imaging systems incorporating the antennas of the present invention, are also disclosed.

94 Claims, 23 Drawing Sheets

U.S. PATENT DOCUMENTS

| | | | |
|---|---|---|---|
| 5,503,495 | A | 4/1996 | Mak et al. |
| 5,575,287 | A | 11/1996 | Eydelman |
| 5,583,438 | A | 12/1996 | Eydelman et al. |
| 5,606,259 | A | 2/1997 | Potthast et al. |
| 5,929,639 | A | 7/1999 | Doty |
| 5,939,883 | A | 8/1999 | Green et al. |
| 6,023,166 | A | 2/2000 | Eydelman |
| 6,025,717 | A | 2/2000 | Hertz et al. |
| 6,028,429 | A | 2/2000 | Green et al. |
| 6,107,974 | A | 8/2000 | Votruba et al. |
| 6,137,291 | A | 10/2000 | Szumowski et al. |
| 6,284,971 | B1 | 9/2001 | Atalar et al. |

OTHER PUBLICATIONS

Jeffrey R. Fitzsimmons, et al., "Double Resonant Quadrature Birdcage", Magnetic Resonance in Medicine, vol. 30, pp. 107–114, 1993.

Siew Kan, et al., "Single–Input Double–Tuned Foster–Type Probe Circuit", Magnetic Resonance In Medicine, vol. 26, pp. 7–14, 1992.

K. Derby, et al., "Design and Evaluation of a Novel Dual–Tuned Resonator for Spectroscopic Imaging", Journal of Magnetic Resonance, vol. 86, pp. 645–651, 1990.

J.R. Fitzsimmons, et al., "A Comparison of Double–Tuned Surface Coils", Magnetic Resonance In Medicine, vol. 10, pp. 302–309, 1989.

Nina C. Gonnella, et al., "Design and Construction of a Simple Double–Tuned, Single–Input Surface–Coil Probe", Journal of Magnetic Resonance, vol. 85, pp. 24–34, 1989.

P. Van Hecke, et al., "Double–Tuned Resonator Designs for NMR Spectroscopy", Journal of Magnetic Resonance, vol. 84, pp. 170–176, 1989.

D. Ballon, et al., "Doubly Tuned Solenoidal Resonators for Small Animal Imaging and Spectroscopy at 1.5 Tesla", Magnetic Resonance Imaging, vol. 7, pp. 155–162, 1989.

Jeffrey R. Fitzsimmons, et al., "A Transformer–Coupled Double–Resonant Probe for NMR Imaging and Spectroscopy", Magnetic Resonance in Medicine, vol. 5, pp. 471–477, 1987.

A.B. Macnee, "VHF Amplifiers, Mixers, and Oscillators", Microwave Receivers, Chapter 5, pp. 122–125, S.N. Van Voorhis, editor, Dover Publications, Inc., NY, 1966.

Leland H. Hemming, "Piping", Architectural Electromagnetic Shielding Handbook, Chapter 7.5, pp. 118–124, 1992.

Edward F. Vance, "Coupling to Shielded Cables", John Wiley and Sons, NY, pp. 112–131, 1978.

Stephen A. Maas, "The RF and Microwave Circuit Design Cookbook", Artech House, Boston, pp. 3–17, 1998.

N. Marcuvitz, editor, "Waveguide Handbook", Dover Publications, Inc., N.Y., pp. 66–89, 1951.

Robert L. Shrader, "Electrical Fundamentals for Technicians", Second Edition, McGraw–Hill, Inc., pp. 389–411, 1977.

U.S. patent application Ser. No. 09/738,233, Eydelman, filed Dec. 15, 2000.

U.S. patent application Ser. No. 09/738,236, Eydelman et al., filed Dec. 15, 2000.

MRI ANTENNA

BENEFIT OF PROVISIONAL APPLICATION

The present application claims the benefit of U.S. Ser. No. 60/172,199, filed on Dec. 17, 1999. assigned to the assignee of the present application and incorporated by reference herein.

Related Applications

The present application is related to U.S. Ser. No. 09/738,236, and U.S. Ser. No. 09/738,233, both filed on the same day as the present application, assigned to the assignee of the present application and incorporated by reference, herein.

FIELD OF THE INVENTION

This invention relates to radio frequency receiving and transmitting antennas, and, more particularly, to receiving and transmitting radio frequency antennas for use in magnetic resonance imaging.

BACKGROUND OF THE INVENTION

Magnetic resonance imaging ("MRI") is a well known, highly useful technique for diagnosing abnormalities in biological tissue. MRI can detect abnormalities which are difficult or impossible to detect by other techniques, without the use of x-rays or invasive procedures.

MRI uses changes in the angular momentum or spin of the atomic nuclei of certain elements within body tissue in a static magnetic field after excitation by radio frequency energy, to derive images containing useful information concerning the condition of the tissue. During an MRI procedure, the patient is inserted into an imaging volume containing a static magnetic field. The vector of the angular momentum or spin of nuclei containing an odd number of protons or neutrons tends to align with the direction of the magnetic field. A transmitting antenna within the imaging volume emits a pulse or pulses of radio frequency energy having a particular bandwidth of frequency, referred to as the resonant or Larmor frequency, shifting the vectors of the nuclei out of alignment with the applied magnetic field. The spins of the nuclei then turn or "precess" around the direction of the applied primary magnetic field. As their spins precess, the nuclei emit small radio frequency signals, referred to as magnetic resonance ("MR") signals, at the resonant or Larmor frequency, which are detected by a radio frequency receiving antenna tuned to that frequency. The receiving antenna is typically positioned within the imaging volume proximate the patient. Gradient magnetic fields are provided to spatially encode the MR signals emitted by the nuclei. After the cessation of the application of radio frequency waves, the precessing spins gradually drift out of phase with one another, back into alignment with the direction of the applied magnetic field. This causes the MR signals emitted by the nuclei to decay. The MR signals detected by the receiving antenna are amplified, digitized and processed by the MRI system. The same antenna may act as the transmitting and receiving antenna. Hydrogen, nitrogen-14, phosphorous-31, carbon-13 and sodium-23 are typical nuclei detected by MRI. Hydrogen is most commonly detected because it is the most abundant nuclei in the human body and emits the strongest MR signal.

The rate of decay of the MR signals varies for different types of tissue, including injured or diseased tissue, such as cancerous tissue. By known mathematical techniques involving correlation of the gradient magnetic fields and the particular frequency of the radio frequency waves applied at various times with the rate of decay of the MR signals emitted by the patient, it is possible to determine the concentrations and the condition of the environment of the nuclei of interest at various locations within the patient's body. This information is typically displayed as an image with varying intensities, which are a function of the concentration and environment of the nuclei of interest. Typical MRI systems are the Quad 7000 and Quad 12000 available from FONAR Corporation, Melville, N.Y., for example.

The quality of the magnetic resonance image is directly related to the characteristics of the receiving and transmitting antenna. Significant electrical characteristics of the antenna include its sensitivity, Q factor and the signal-to-noise ratio.

Sensitivity is the signal voltage generated in the receiving antenna by MR signals of a particular magnitude. The higher the sensitivity within the region to be imaged, the weaker the signals which can be detected. The sensitivity of the antenna is preferably substantially uniform with respect to MR signals emanating from all volume elements within the region of the subject which is to be imaged.

The Q or quality factor, which is closely related to the sensitivity of the antenna, is a measure of the ability of the antenna to amplify the received signal. The Q-value of the antenna can be lowered by a patient proximate or within an antenna, due to capacitive and to a lessor extent the inductive coupling between the patient and the antenna. Antennas must therefore have a high Q-value when they are unloaded and the Q-value must not become too diminished by the presence of the patient. On the other hand, the coil must couple well with the region of a patient's anatomy which is to be imaged.

Signal-to-noise ("S/N") ratio is the ratio between those components in the electrical impulses appearing at the antenna terminals representing the detected MR signals and the components representing spurious electromagnetic signals in the environment and internally generated thermal noise from the patient. To optimize the S/N ratio, the antenna should have low sensitivity to signals from outside the region to be imaged and to thermal noise. To enhance both S/N ratio and sensitivity, the antenna is "tuned" or arranged to resonate electrically at the frequency of the MR signals to be received (the Larmor frequency), which is typically several megahertz or more. Neither the coil size nor geometry of the antenna can be allowed to create an inductance or self-capacitance which prevents tuning to the desired frequency.

The antenna must also meet certain physical requirements. The antenna should have a high filling factor, which maximizes the amount of tissue which fits within the volume detected by the windings of the coil. The antenna must also fit within the relatively small imaging volumes typically provided for receiving the subject within the magnet assembly, along with other components of the system and the subject. The antenna should not cause significant discomfort to the subject. Additionally, the antenna should be easy to position with respect to the subject, and be relatively insensitive to minor faults in positioning relative to the subject.

These numerous considerations often conflict with one another and therefore must be balanced during the design process.

The sensitivity and S/N ratio of MRI radio frequency receiving antennas have been improved by positioning a first coil, tuned to resonate at the Larmor frequency of the species of interest, proximate the part of the subject which is to be imaged, and positioning a similarly tuned second coil, typically a single loop, adjacent to the first coil. The second coil is connected to the preamplifier of the MRI system. The first and second coils are inductively coupled to each other. MR signals emitted by the patient induce voltages in the first winding, causing current to flow within the winding. The current generates a magnetic field which induces voltage in the second winding. The MR signals may induce voltages in the second coil, as well. The voltages induced in the second coil are processed by the MRI system. Use of such first and second coils amplify the MR signals, and the second coil filters spurious signals outside of the frequency band of the Larmor frequency. See, for example, U.S. Pat. Nos. 5,583, 438 and 5,575,287, assigned to the assignee of the present invention.

Radio frequency antenna coils may be used in a variety of configurations. For example, the coil may be receiving coil, as discussed above. The receiving coil may be part of an array of receiving coils, such as in the primary and secondary coil arrangements, discussed above. The receiving coil may also act as the transmitting coil of the MRI system. A pair of receiving coils can also be arranged 90° with respect to each other to enable quadrature detection, which improve the signal-to-noise ratio.

SUMMARY OF THE INVENTION

In accordance with the present invention, receiving and transmitting antennas for use in magnetic resource imaging comprise inductively coupled first and second windings tuned to the same frequency, typically the Larmor frequency of species of interest. In a receiving antenna, the second winding is connected to the receiver subsystem of an MRI system.

It is believed, without limiting the scope of the invention, that in antennas of the design of the present invention, the first winding substantially shields the second winding from direct reception of magnetic resonance ("MR") signals. However, since the windings are inductively coupled, MR signals detected by the first winding induce voltage signals in the second winding. Since both windings are tuned to the same frequency, highly filtered signals are provided for analysis by the MRI system. The first and second windings may form a coaxial cable. Multiple coaxial cables may be suitably coupled to form antenna arrays for use with different parts of the body.

In a transmitting antenna, the second winding is connected to the radio frequency power source in the radio frequency transmitting section of the MRI system. Voltage signals provided to the second winding induce voltage signals and current flow in the first winding, causing the emission of highly filtered radio frequency signals.

In accordance with one embodiment of the present invention, an MRI antenna comprises an inner conductor with first and second ends for being electrically connected across a capacitor to tune the inner conductor to a frequency. The first and second ends provide an output of the antenna. An outer conductor substantially surrounds the inner conductor. The outer conductor also has first and second ends for being electrically connected across a capacitor to tune the outer conductor to the same frequency as the inner conductor. The inner and outer conductors define a region for receiving a body part and are inductively coupled during operation.

The inner and outer conductors preferably define a coaxial cable unit. Multiple coaxial cable units may be provided, wherein the inner conductors of each unit are connected to form a first circuit tunable to a frequency. The outer conductors are also connected to form a second circuit tunable to the frequency. The output is provided from the first circuit. Multiple inner conductors may also be provided, electrically connected to form a circuit tunable to the frequency.

A second outer conductor may be also provided around the first outer conductor, with holes therethrough. It is believed, without limiting the scope of the invention, that magnetic resonance signals may be detected by the first outer conductor, due to the presence of the holes, and that magnetic resonance signals detected by the second outer conductor also induce signals in the first outer conductor. The ends of the second outer conductor are connected through a capacitor to tune the outer conductor to the frequency, as well.

In accordance with another embodiment of the invention, an MRI antenna comprises a first winding and a second winding. The first and second windings are inductively coupled and are each tuned to the same frequency. The first winding substantially shields the second winding from direct detection of magnetic resonance signals emitted from a subject and the second winding provides an output of the antenna.

In accordance with another embodiment of the invention, an MRI antenna comprises a coaxial cable comprising an inner conductor and an outer conductor surrounding the inner conductor. The outer conductor and the inner conductor are inductively coupled and tuned to the Larmor frequency of the species of interest during operation. The inner conductor provides an output of the antenna.

In accordance with another embodiment of the invention, an MRI antenna comprises first, second and third coaxial cable units, each having an outer conductor and an inner conductor. The outer conductor of each unit substantially surrounds the respective inner conductor. The outer conductor and the inner conductors of each unit are inductively coupled to each other during operation. Adjacent coaxial cable units are also inductively coupled during operation. Each coaxial cable unit defines a region for receiving a body part. The outer conductors are electrically connected to form a first circuit tunable to a frequency and the inner conductors are electrically connected to form a second circuit tunable to the frequency. An output from the antenna is provided from the second circuit of the inner conductors. The first, second and third coaxial cable units may lie in parallel planes and may also be aligned along an axis perpendicular to the first, second and third parallel planes. Such an antenna is particularly suited for magnetic resonance imaging of a hand, wrist or toe.

In accordance with another embodiment of the invention, an MRI antenna comprises a first inner conductor with first and second ends and a first outer conductor substantially surrounding the first inner conductor. The first inner conductor and the first outer conductor define a first coaxial cable unit defining a region for receiving a body part. A second inner conductor and a second outer conductor substantially surrounding the second inner conductor, defining a second coaxial cable unit, are also provided. The second inner conductor and the second outer conductor are inductively coupled during operation. The first and second coaxial cable units are concentric and lie in substantially the same plane. The second coaxial cable unit is within a region defined by the first coaxial cable unit. The inner conductors of the first and second coaxial cable units are connected in parallel across a capacitor. The outer conductors are electrically connected as well. Ends of the first coaxial cable unit are also electrically connected across a capacitor. The circuits comprising the inner and outer conductors are tunable to the same frequency. An output of the antenna is provided from the inner conductors.

In accordance with another embodiment of the invention, an MRI antenna comprises a support and first and second coaxial cable units supported by the support in a first plane to define a region for receiving a body part. Each coaxial cable unit comprises an inner conductor and an outer conductor substantially surrounding the inner conductor. The inner conductors of the first and second coaxial cable units are electrically connected, preferably through capacitors, to form a tunable circuit. The outer conductors of the first and second coaxial cable units are also electrically connected, preferably through capacitors, to form a second circuit tunable to the frequency. An output of the antenna is provided from the circuit including the inner conductors.

Third and fourth coaxial cable units may further be supported by the support adjacent to the first and second coaxial cable units in a second plane, and fifth and sixth coaxial cable units may be supported by the support adjacent to the first and second coaxial cable units in a third plane. The third plane is on an opposite side of the first and second coaxial cable units as the second plane. The inner and outer conductors of the third, fourth, fifth and sixth coaxial cable units are connected in series, preferably through capacitors, to form a single circuit tunable to the frequency. The inner and outer conductors are inductively coupled during operation.

Seventh and eighth coaxial cable units may also be supported by the support in a fourth plane between the first plane and the third plane to define a further region for receiving the body part. The seventh and eighth coaxial cable units also comprise an inner conductor and an outer conductor substantially surrounding the inner conductor, and are inductively coupled during operation. The inner conductors are electrically connected to form a circuit tunable to the frequency and the outer conductors are preferably electrically connected to form a circuit tunable to the frequency, also preferably, through capacitors.

Preferably, ends of the inner conductors and ends of the outer conductors in the pairs of coaxial cable units in each plane are electrically connected through capacitors, to lower the inductance of the respective circuits. Such an antenna is suitable for imaging the head and neck.

Magnetic resonance imaging systems comprising such antennas are also disclosed. The antennas may also be used as transmitting antennas.

BRIEF DESCRIPTION OF THE DRAWINGS

FIG. 34 is a cross-sectional view of the triaxial cable unit of FIG. 34, along line 34a—34a;

DETAILED DESCRIPTION OF THE INVENTION

Figure 1:
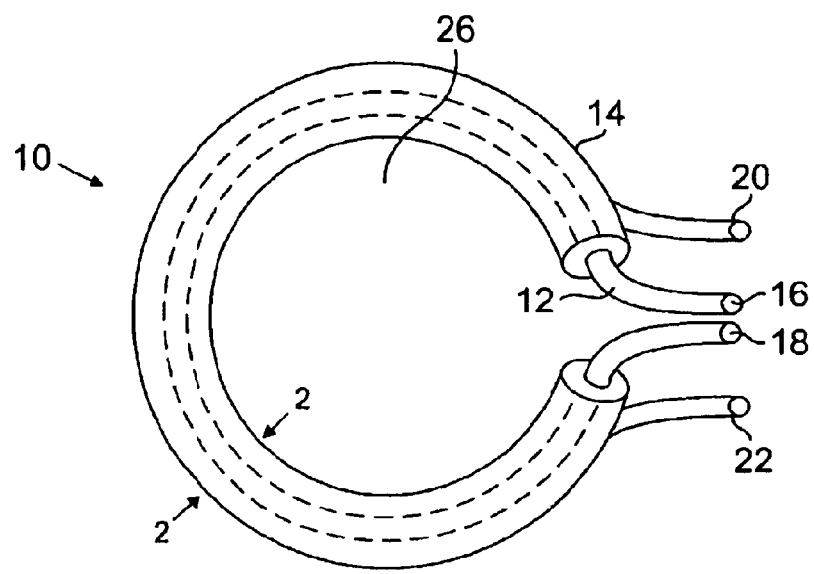
FIG. 1 is a plan view of a basic coaxial cable unit of an MRI antenna in accordance with one embodiment of the present invention.

FIG. 1 is a plan view of a basic coaxial cable unit 10 of an MRI antenna in accordance with one embodiment of the present invention. The unit 10 comprises an inner conductor 12 and an outer conductor 14 coaxially arranged, as shown in the cross-sectional view of FIG. 2. The inner conductor 12 and the outer conductor 14 are separated by a dielectric material 24, such as Teflon®, for example, forming a coaxial cable unit 10. The coaxial conductors 12, 14 are inductively coupled to each other. Preferably, the inner and outer conductors 12, 14 are tightly coupled to each other. More preferably, they are critically coupled to each other.

The inner conductor 12 has two ends 16, 18 and the outer conductor 14 has two ends 20, 22. A plurality of basic units 10 may be connected or coupled to each other in different combinations to form an antenna array, as discussed below.

A body part to be imaged is received in the region 26 bounded by the coaxial cable unit 10. In FIG. 1, the coaxial conductors are in the shape of a ring. Other shapes may be used, dependent on the body part being imaged.

Figure 2:
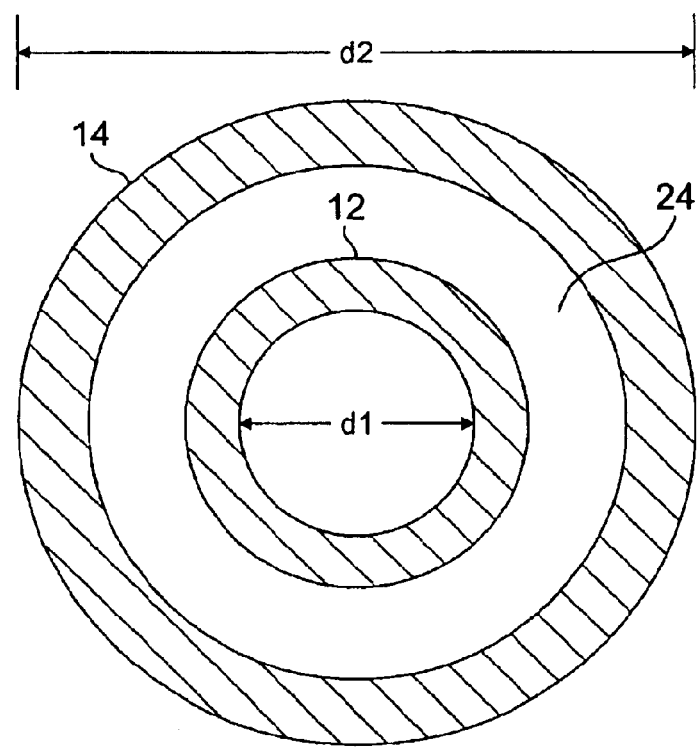
FIG. 2 is a cross-sectional view of the basic coaxial cable unit 10, along line 2—2 in FIG. 1.
Figure 3:
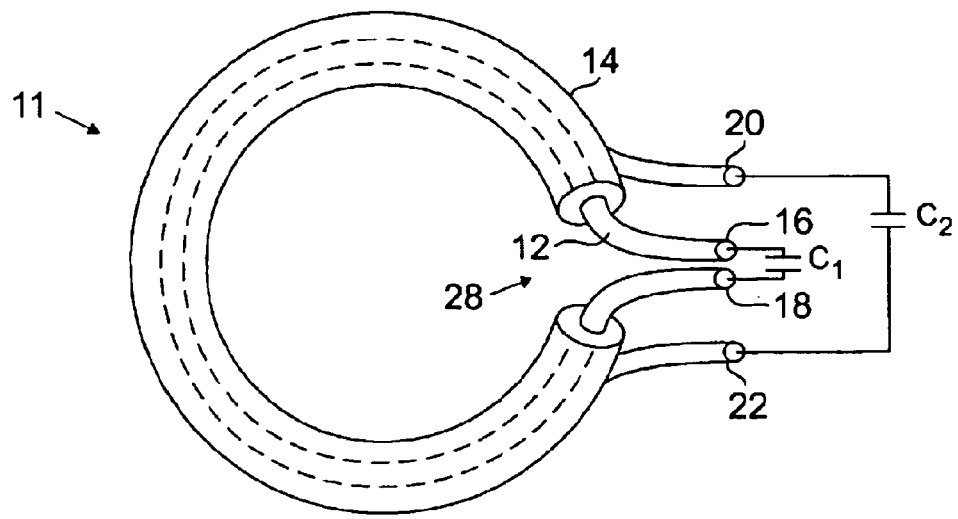
FIG. 3 shows the basic coaxial cable unit of FIG. 1, with electrical connections to form an antenna in accordance with one embodiment of the present invention.

In one example, the outputs 16, 18 of the inner conductor 12 are connected to each other through a capacitor $C_1$ and the outputs 20, 22 of the outer conductor 14 are connected to each other through a capacitor $C_2$ to form an antenna 11, as shown in FIG. 3. The capacitors $C_1$, $C_2$ have values such that the inner and outer conductors 12, 14 are tuned to the Larmor frequency of the species of interest, such as hydrogen. The capacitor $C_1$ may be connected to a variable capacitor ("varactor") in the preamplifier of the receiver system of an MRI system, or it may be the varactor in the preamplifier. Each conductor 12, 14 may be copper tubing. As shown in FIG. 2, the inner diameter "$d_1$" of the inner conductor 12 may be about 0.125 inches. The diameter "$d_2$" of the outer conductor 14 may be about 0.25 inches. The wall thickness of each conductor 12, 14 may be about 0.032 inches.

The coaxial cable unit 10 may be made from readily available soft copper refrigeration tubing of appropriate diameters. Such tubing may be obtained from Metal Product, Wynne, Ark., for example. The tubing corresponding to the inner conductor 12 is covered by a Teflon® tubing, such as TFT70C polytetrafluoroethylene, available from AIN Plastics, Inc., Mount Vernon, N.Y., for example. The Teflon® covered inner conductor 12 is inserted through the tubing corresponding to the outer conductor 14, forming the coaxial cable unit 10. The coaxial cable unit 10 may also be flexible. One-quarter inch, High Power, High Temperature Dielectric Coaxial Cable, Andrew HST1-50HELIAX, available from Andrew Corporation, Orland Park, Ill., may be used, for example.

The inner conductor 12 is shielded from direct reception of the MR signals by the outer conductor 12. However, voltage signals induced in the outer conductor 14 induce voltage signals in the inner conductor 12. The outer conductor 14 may, therefore, be modeled as a primary winding of a transformer while the inner conductor 12 may be modeled as the secondary winding of the transformer.

Figure 4:
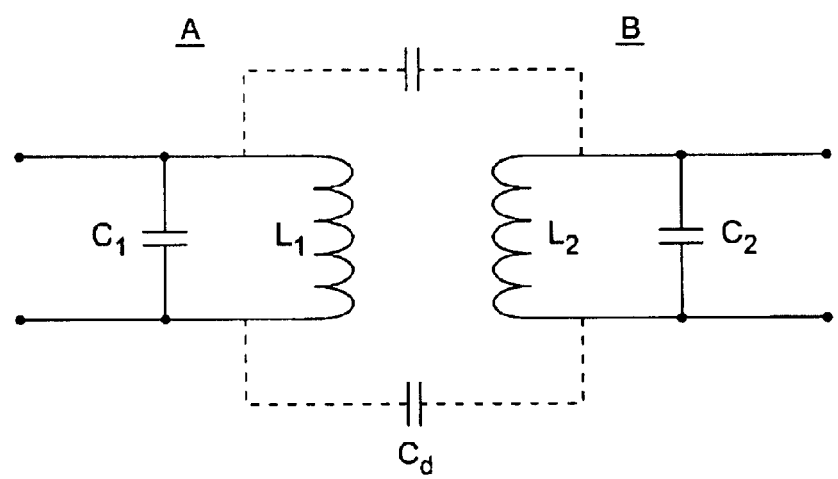
FIG. 4 is a schematic diagram of a circuit corresponding to the antenna of FIG. 3.

FIG. 4 is a schematic diagram of a circuit corresponding to the antenna of FIG. 3. The inner conductor 12 and the outer conductor 14 are represented as inductors $L_1$, $L_2$, respectively. The capacitors $C_1$ and $C_2$ are shown, as well. The inductor $L_1$ and the capacitor $C_1$ form a first circuit "A" and the inductor $L_2$ and the capacitor $C_2$ form a second circuit "B". The inductors $L_1$, $L_2$ are inductively coupled to each other and have a distributed capacitance Cd. The two circuits are tuned to the same, Larmor frequency, forming anti-resonant or parallel resonant, double-tuned circuits. The circuits A, B form a bandpass network which filters frequencies outside of the bandpass of the two circuits. The bandpass of the circuit B (corresponding to the inner conductor 12) is narrower than the bandpass of the circuit A (corresponding to the outer conductor 14), as is known in the art. Noise and other signals outside of the narrower bandwidth of the inner conductor 12 are therefore filtered. As mentioned above, in the embodiment of FIG. 3, the inner conductor 12 is connected to the receiver subsystem of an MRI device, providing highly filtered signals for analysis.

Figure 5:
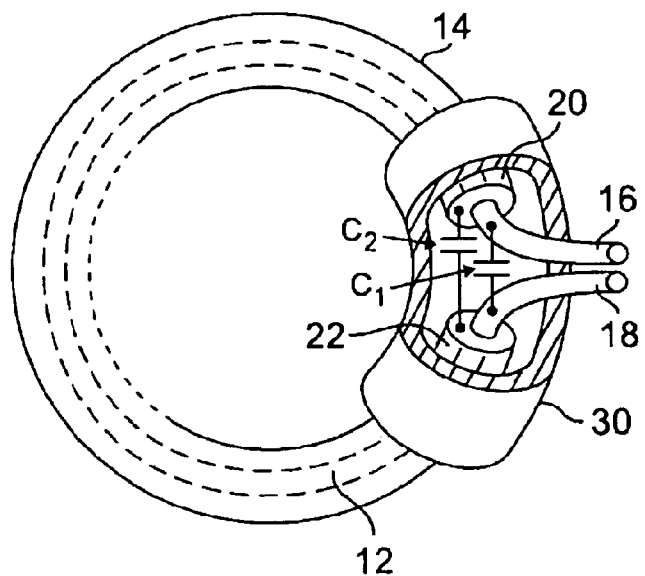
FIG. 5 shows the basic unit of FIG. 1, with a shielding adapter.

The outer conductor 14 also shields the inner conductor 12 from capacitive coupling with the body of the patient over most of its length. As shown in FIG. 3, however, the inner conductor 12 may not be effectively shielded by the outer conductor 14 in the gap 28 between the ends of the outer conductor 14. To improve the shielding effect of the outer conductor 14 on the inner conductor 12, the ends 20, 22 of the outer conductor 14 may be connected through a copper tube adaptor 30, which closes the gap 28 between the ends of the inner and outer conductors 12, 14, as shown in FIG. 5. The adaptor 30 acts as a capacitive connection between the ends 20, 22 of the outer conductor 14, as well as shielding the outputs 16, 18 of the inner conductor 12. The adaptor 30 also minimizes field distributions in the gap 28 between the ends of the conductors 12, 14.

Two capacitors $C_1$, $C_2$ are provided within the adaptor 30, electrically connecting in series the first and second ends 16, 18 of the inner conductor 12 and the first and second ends 20, 22 of the outer conductor 14, respectively. The exposed ends, 16, 18 of the inner conductor 14 and the capacitors $C_1$, $C_2$ are shielded by the adaptor 30.

Figure 6:
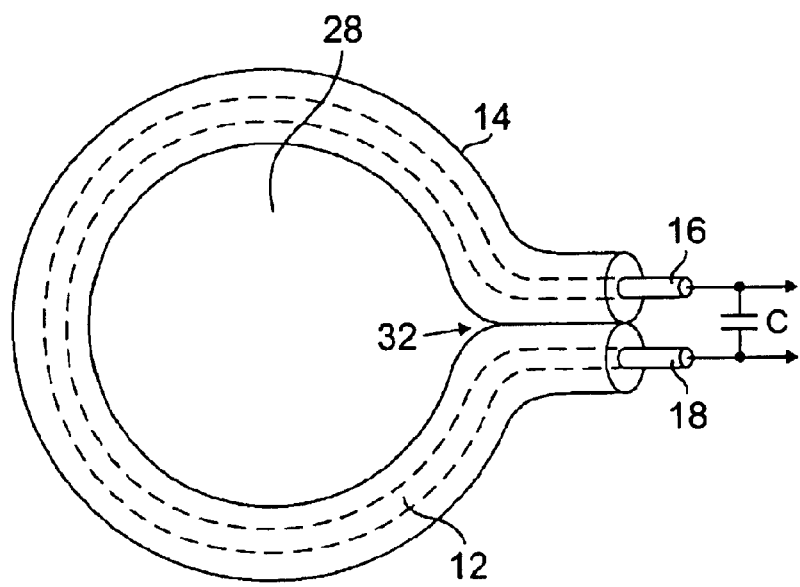
FIG. 6 shows another shielding technique.

The direct exposure of the inner conductor 12 to MR signals from within the area 28 may also be minimized by distancing the exposed ends 16, 18 from the source of the MR signals in the region 28 and positioning more of the outer conductor 14 between the inner conductor 12 and the source of MR signals within the coil, as shown in FIG. 6.

Figure 7:
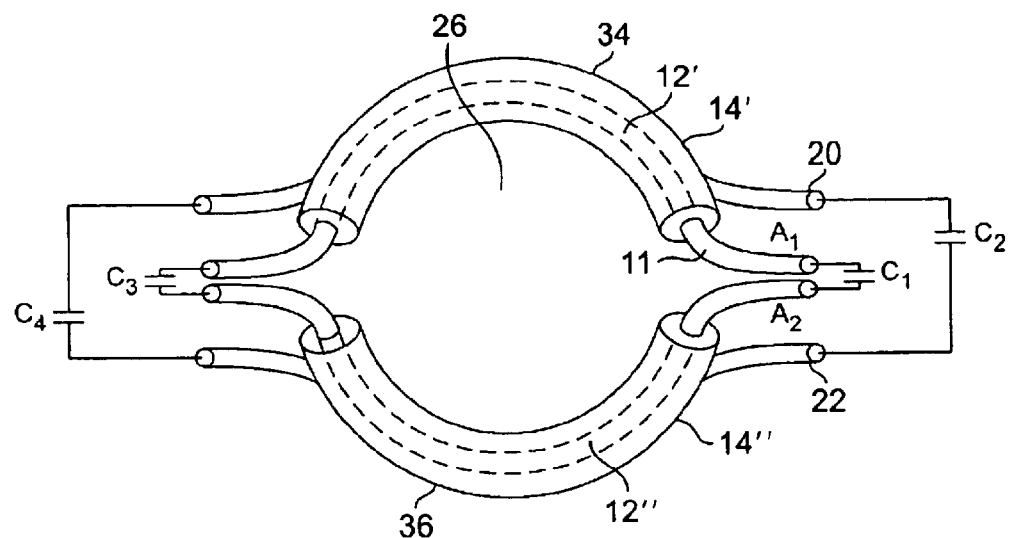
FIG. 7 shows a variation of the basic unit of FIG. 1, comprising two sections of coaxial cable, and their electrical connections.

Dependent on the overall length of the coaxial ring and the magnetic field strength of the magnet used in the MRI system, in order to tune the antenna 11 of FIG. 3 to the Larmor frequency, the inductance of the inner and outer conductors 12, 14 of the coaxial cable may need to be decreased. The inductance may be decreased by decreasing the lengths of the inner and outer conductors 12, 14, as is known in the art. For example, the inner and outer conductors 12, 14 may be split into two sections 34, 36, as shown in FIG. 7, to facilitate their being tuned to the higher frequencies used in higher field strength magnets. The ends of the inner conductor 12 of a first section 34 are connected in series through respective capacitors $C_1$, $C_3$ to the ends of the inner conductor 12" of the second section 36. The ends of the outer conductor 14" of the first section 34 are similarly connected in series to the ends of the outer conductors 14" of the second section 36 through respective capacitors $C_2$, $C_4$. The values of the capacitors $C_1$, $C_2$, $C_3$, $C_4$ are adjusted to tune the conductors 12', 12", 14', 14" to the desired frequency. Either the capacitor $C_1$ or the capacitor $C_3$ may be connected to the variable capacitor in the preamplifier of the MRI system, or may be the variable capacitor in the preamplifier.

Figure 8:
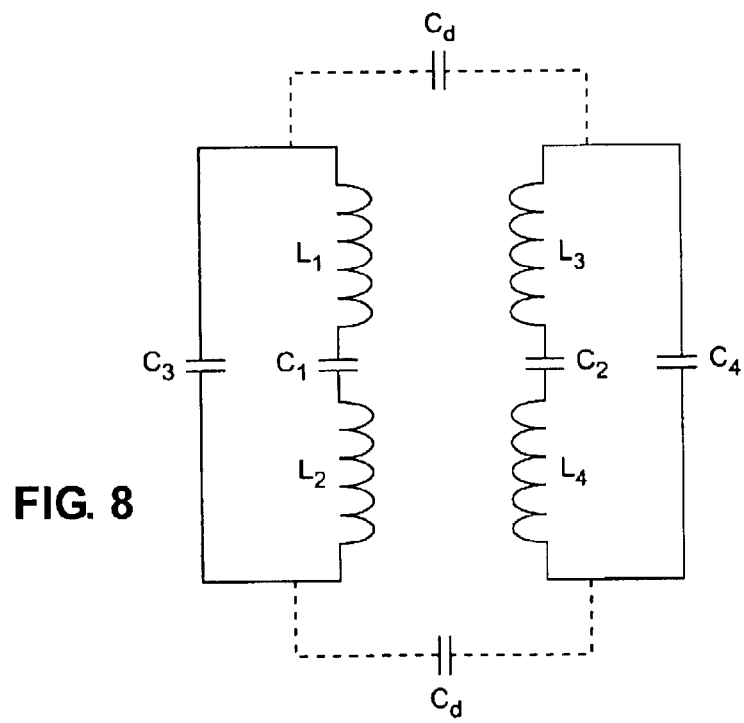
FIG. 8 is a schematic diagram of a circuit corresponding to the configuration of FIG. 7.

FIG. 8 is a schematic diagram of the circuit corresponding to the configuration of FIG. 7. In this case, the inner conductors 12', 12" correspond to the inductors $L_1$, $L_2$ which are connected in series through capacitors $C_1$, $C_3$. The outer conductors 14', 14" correspond to the inductors $L_3$, $L_4$, respectively, which are connected in series through the capacitors $C_2$ and $C_4$. As above, the outer conductor 14 ($L_3$, $L_4$) and the inner conductor 12 ($L_1$, $L_2$) are inductively coupled.

Figure 9:
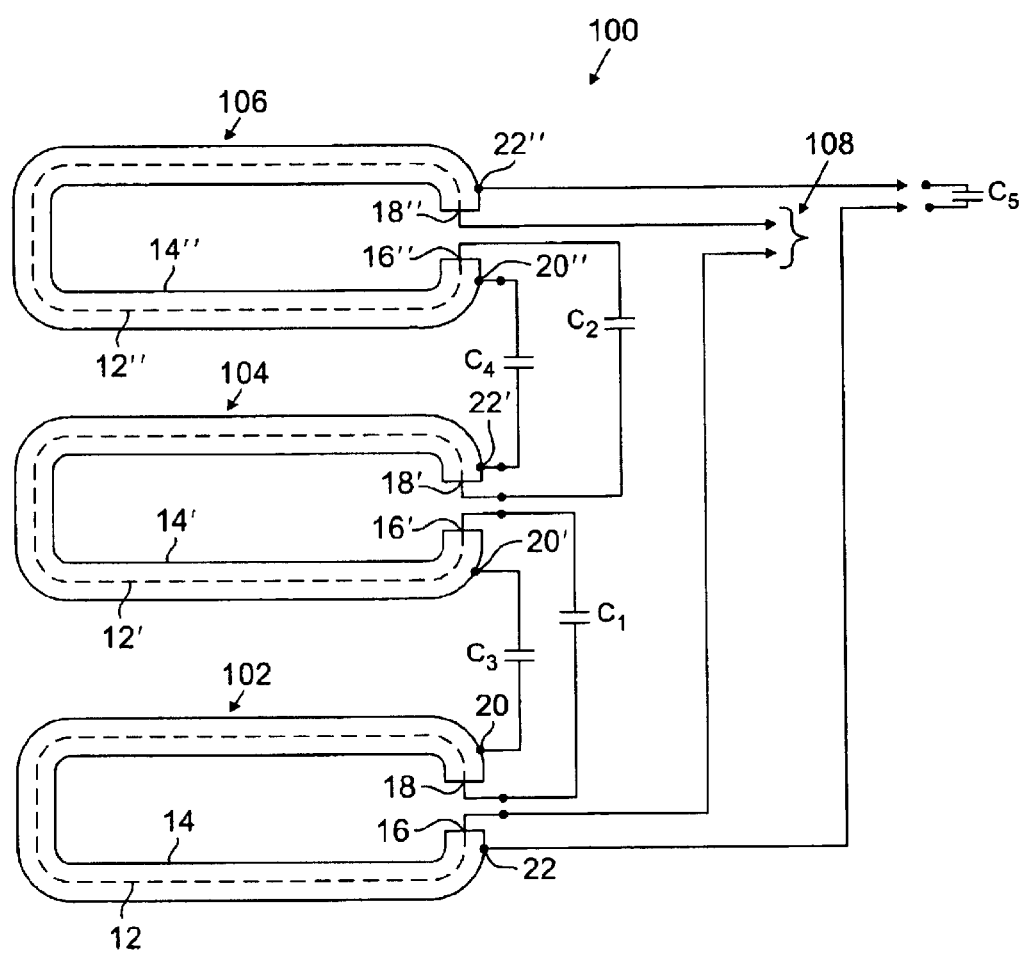
FIG. 9 is a schematic representation of an antenna array 100 appropriate for imaging of a hand, wrist or toe, using three basic coaxial cable units, in accordance with the present invention.
Figure 10:
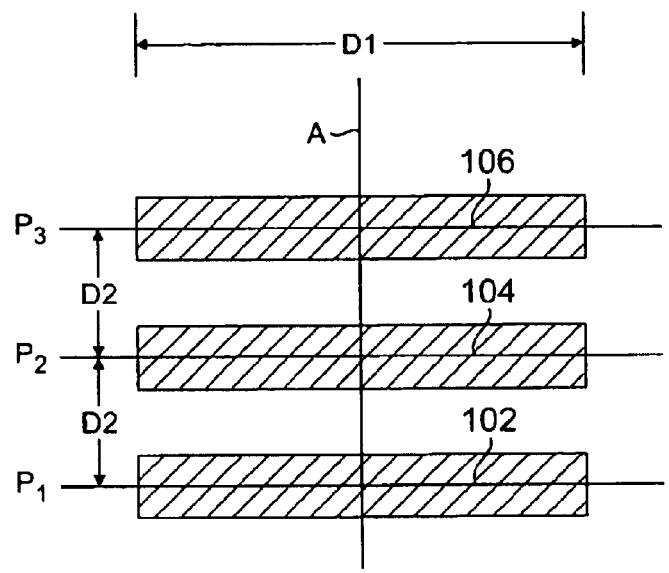
FIG. 10 is a schematic representation of the side view of the antenna array of FIG. 9.

FIG. 9 is a schematic diagram of an antenna array 100 appropriate for imaging of a hand, wrist or toe, using three coaxial cable ring units 102, 104, 106 as in FIG. 1, in accordance with one embodiment of the present invention. The coaxial ring units 102, 104, 106 lie in three respective parallel, vertical planes P1, P2, P3, respectively, as shown in FIG. 10. To better accommodate the hand, wrist or toe, such that the outer conductors are close to the body party, each unit has a rectangular shape. The antenna array 100 may be used for imaging other body parts, as well. The shape of each unit may be varied as appropriate to accommodate and maintain suitable proximity to the body part.

Each unit 102, 104, 106 has an inner conductor 12, 12', 12", respectively, and an outer conductor 14, 14', 14". A first, top end 16 of the inner conductor 12 of the first unit 102 is electrically connected in series to a first, bottom end 16' of the inner conductor 12' of the second unit 104 through a capacitor $C_1$. The second, top end 18' of the inner conductor 12' is electrically connected in series to the bottom end 16" of the inner conductor 12" of the third unit 106 through a capacitor $C_2$. The second, bottom end 18 of the inner conductor 12 of the first unit 102 and the second, top end 18" of the inner conductor 12" of the third unit 106 provide an output 108 of the antenna array 100. The output 108 may be connected across a capacitor (not shown) which may be connected to or may be the varactor of the preamplifier of the receiver system of the MRI device. The output 108 may be connected to the preamplifier through a BNC connector acting as a capacitive module.

The top end 20 of the outer conductor 14 of the first unit 102 is electrically connected in series to the bottom end 20' of the outer conductor 14' of the second unit 104, through a capacitor $C_3$. The top end 22' of the outer conductor 14' is electrically connected in series to the first, bottom end 20" of the outer conductor 14" of the third unit 106 through a capacitor $C_4$. The bottom end 22 of the outer conductor 14 of the first unit 102 and the second, top end 22" of the third unit 106 are electrically connected in series through the capacitor $C_5$, which is part of a BNC connector acting as a capacitive module.

Figure 11:
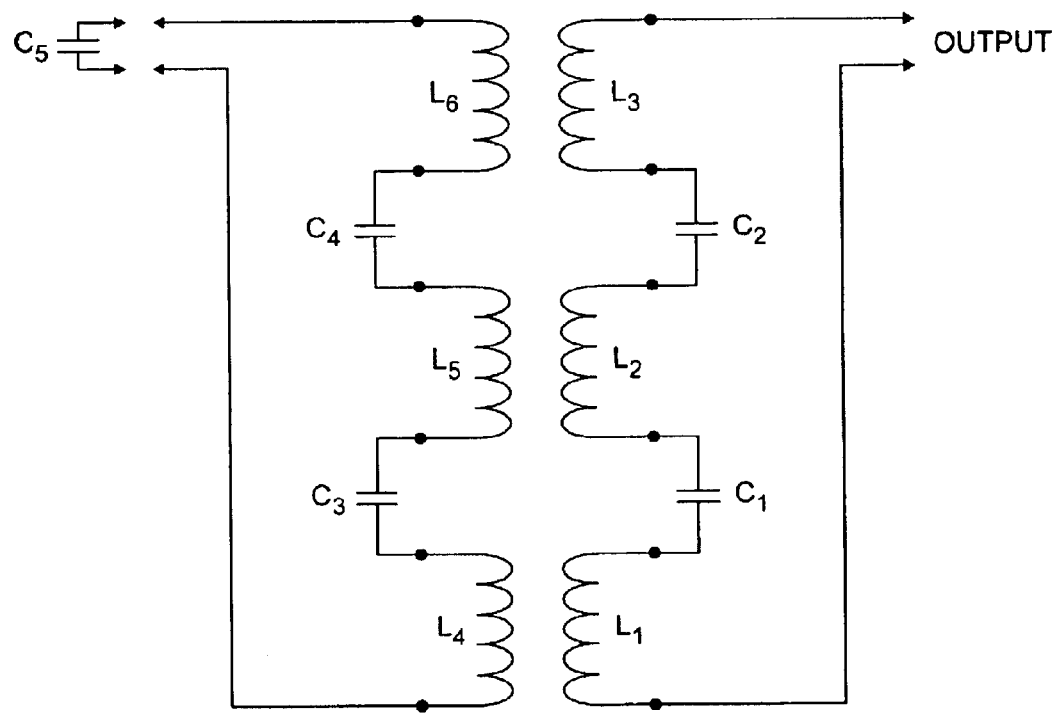
FIG. 11 is a schematic representation of a circuit corresponding to the antenna array of FIG. 9.

The antenna array 100 of FIG. 9 may be represented as three-double tuned transformers connected in series, as shown in FIG. 11. The inductors $L_1$, $L_2$, $L_3$ correspond to the inner conductors 12, 12', 12" of the first, second and third units 102, 104, 106, respectively, and the inductors $L_4$, $L_5$, $L_6$ correspond to the outer conductor 14, 14' and 14". In one implementation, for use in an MRI system including a magnet with a field strength of from about 6,000 Gauss to about 8,000 Gauss, capacitor $C_1$=68 picofarads; capacitor $C_2$=56 picofarads; capacitor $C_3$=22 picofarads; and capacitor $C_4$=22 picofarads. The inner and outer conductors 12, 14 were tuned to the Lamar frequency of hydrogen for the particular magnet field strength, which in the range of 6,000 to 8,000 Gauss is between about 25–35 megahertz. The length "D1" (FIG. 9) of each coaxial cable unit 102, 104, 106 was 7 inches. The distance "$D_2$" (FIG. 10) between the center of adjacent coaxial cable units was 1.5 inches. The Q of the antenna array 100 was found to be about 197 while the S/N ratio was found to be 320 to 1.

While an antenna array comprising three coaxial cable units preferred, the antenna array 100 could comprise the two coaxial cables 102 and 106, in which case, the first end 16 of the inner conductor 12" of the first coaxial cable 102 would be connected to the first end 16 of the inner conductor 12 coaxial cable unit 106 and the first end 20 of the outer conductor 14 would be connected to the first end 20" of the outer conductor 14" coaxial cable unit 106. The outputs of the antenna array would be the same.

Figure 12:
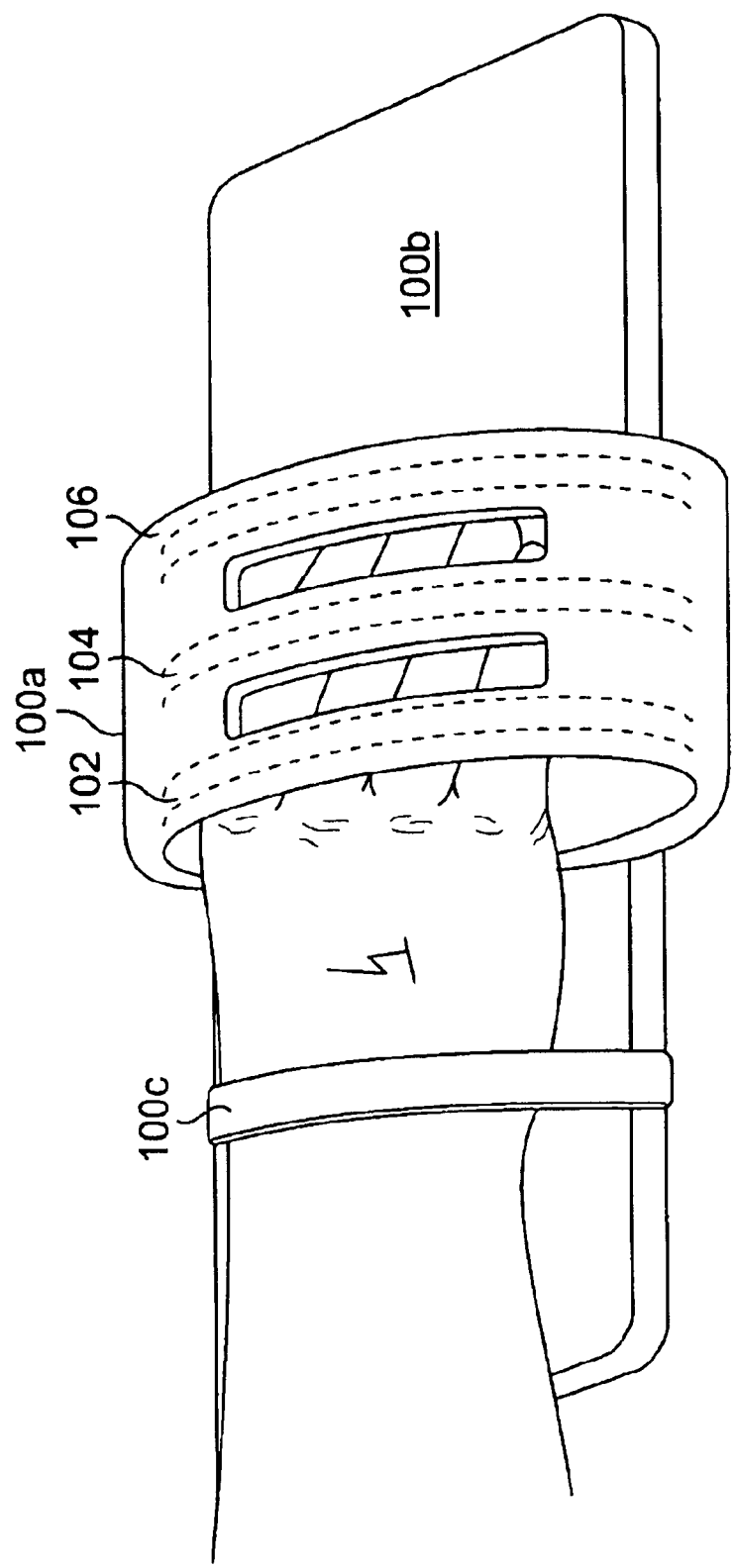
FIG. 12 is a perspective view of the antenna array of FIG. 9, encased in a base of dielectric material, in use with a patient.

The antenna array 100 is preferably encased in a base 100a of a rigid, dielectric material, such as the fire resistant polymers polyvinyl chloride, polytetrafluoroethylene and fluorinated ethylene propylene, as shown in FIG. 12. Polymers having low dielectric constants are particularly preferred. In FIG. 12, the first, second and third coaxial cable units 102, 104, 106 are shown in phantom. The coaxial cable units 102, 104, 106 are coaxially aligned along an axis A through the center of the base 100a, as discussed above with respect to FIG. 11. The base 100a is connected to a plate 100b which may be positioned on the patient bed within the gap of the MRI magnet. A patient's hand ("h") is shown, partially inserted into a region within each of the coaxial cable units 102, 104, 106, for magnetic resonance imaging of the fingers, for example. A strap 100c may be provided to restrain movement of the hand h during imaging.

Flexible coaxial cable units can also be supported by a flexible belt. An example of a flexible coaxial cable is described above. The flexible belt can comprise cross-linked polyethylene foam, available from Contour Fabricators, Inc., Grand Blanc, Mich.

Figure 13:
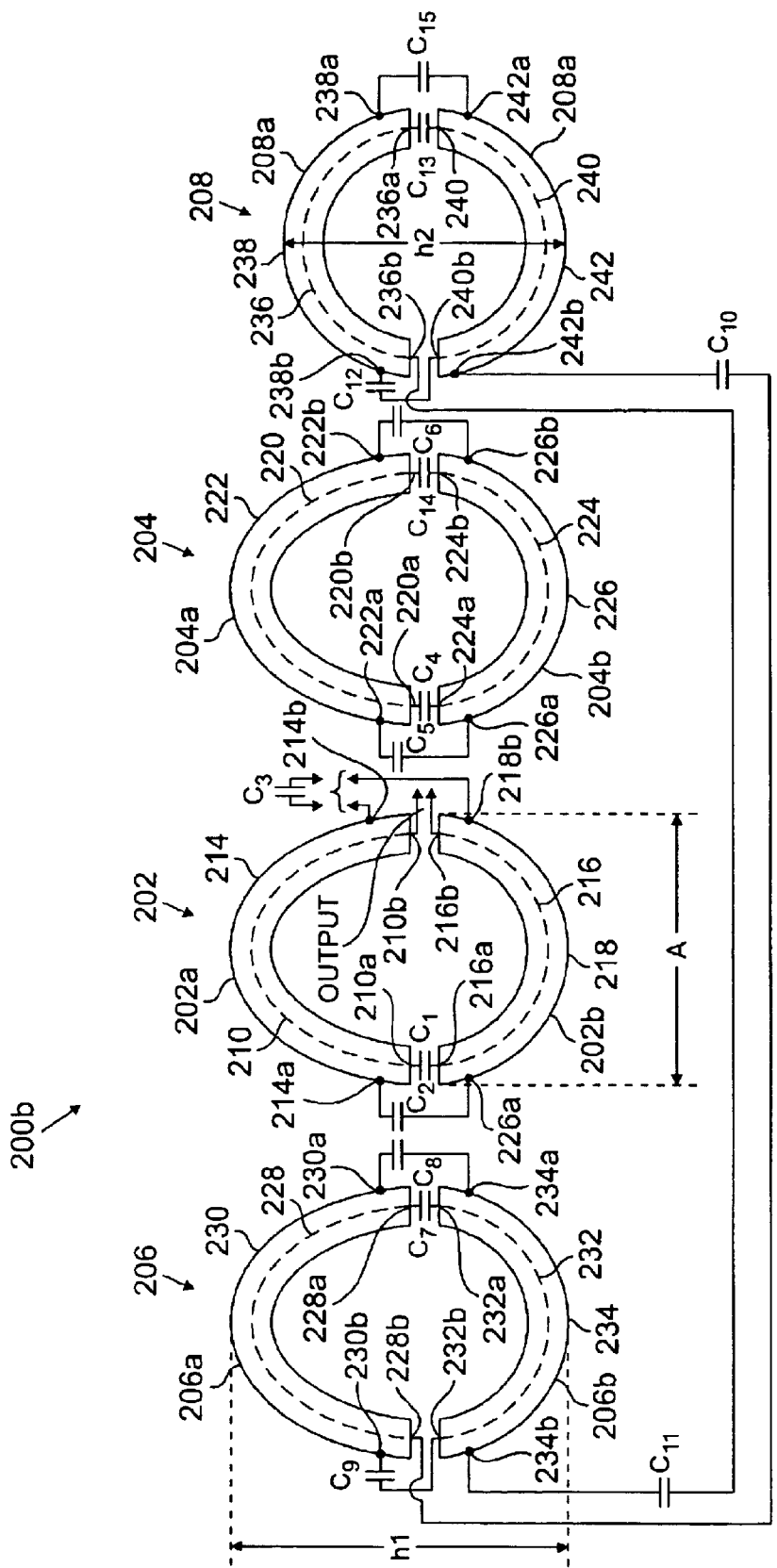
FIG. 13 is a schematic diagram of an antenna array in accordance with another embodiment the present invention, which is particularly suited for imaging the head and neck.
Figure 14:
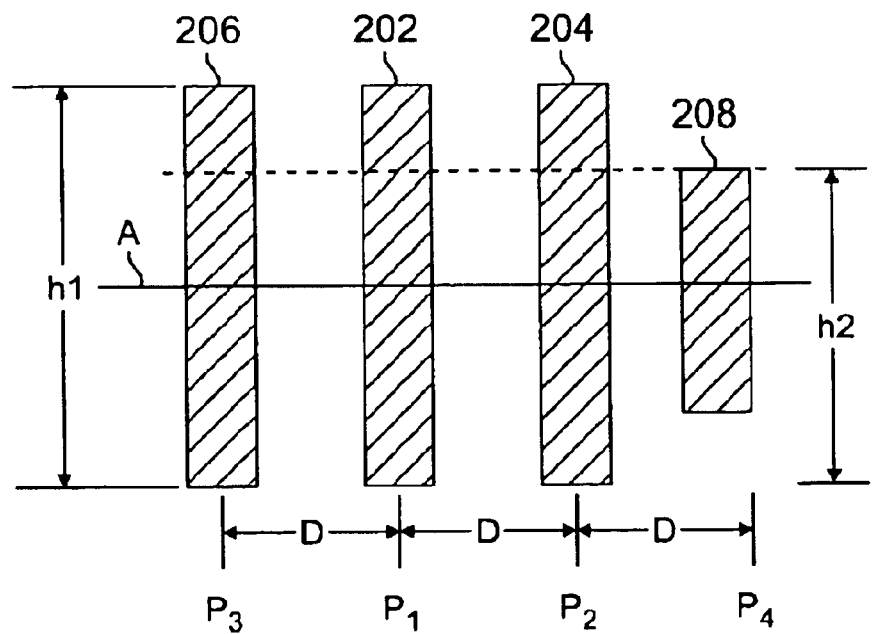
FIG. 14 is a side view of the antenna array of FIG. 13, wherein four coaxial units are each in respective vertical, parallel planes, and the center of each unit lies along the same axis.

FIG. 13 is a schematic diagram of an antenna array 200 in accordance with another embodiment the present invention, which is particularly suited for imaging the head and neck. FIG. 14 is a side view of the array, wherein four coaxial ring units 202, 204, 206, 208 are each in respective vertical, parallel planes P1, P2, P3, P4 and the center of each unit lies along the same axis "A".

Returning to FIG. 13, because larger conductors are needed to surround the head, each coaxial ring unit preferably has two sections to lower the inductance of the conductor, as discussed above with respect to the embodiment of FIG. 7. Each section has an outer conductor with first and second ends and an inner conductor with first and second ends.

In the first unit 202, the upper section 202a has an inner conductor 210 with first and second ends 210a, 210b and an outer conductor 214 with first and second ends 214a, 214b. Similarly, the lower section 202b has an inner conductor 216 with first and second ends 216a, 216b and an outer conductor 218 with first and second ends 218a, 218b. The first end 210a of the inner conductor 210 is electrically connected in series to the first end 216a of the inner conductor 216 through a capacitor $C_1$. The first end 214a of the outer conductor 214 is electrically connected in series to the first end 218a of the outer conductor 218 through a capacitor $C_2$. The second end 210b of the inner conductor 210 and the second end 216b of the inner conductor 216 provide an Output. The Output would be connected to a varactor in the preamplifier of the receiver system of the MRI device, optionally through a capacitor. The second end 214b of the outer conductor 214 is electrically connected in series to the second end 218b of the outer conductor 218 through a capacitor $C_3$ of a BNC connector capacitive module.

In the second unit 204, the upper section 204a has an inner conductor 220 with first and second ends 220a, 220b and an outer conductor 222 with first and second ends 222a, 222b. Similarly, the lower section 204b has an inner conductor 224 with first and second ends 224a, 224b and an outer conductor 226 with first and second ends 226a, 226b. The first end 220a of the inner conductor 220 is electrically connected in series to the first end 224a of the inner conductor 224 through a capacitor $C_4$. The first end 222a of the outer conductor 222 is electrically connected in series to the first end 226a of the outer conductor 226 through a capacitor $C_5$. The second end 220b of the inner conductor 220 and the second end 224b of the inner conductor 224 are electrically connected in series through a capacitor $C_{14}$. The second end 222b of the outer conductor 222 is electrically connected in series to the second end 226b of the outer conductor 226 through a capacitor $C_6$.

In the third unit 206, the upper section 206a has an inner conductor 228 with first and second ends 228a, 228b and an outer conductor 230 with first and second ends 230a, 230b. Similarly, the lower section 206b has an inner conductor 232 with first and second ends 232a, 232b and an outer conductor 234 with first and second ends 234a, 234b. In the fourth unit 208, the upper section 208a has an inner conductor 236 with first and second ends 236a, 236b and an outer conductor 238 with first and second ends 238a, 238b. The lower section has an inner conductor 240 with first and second ends 240a, 240b and an outer conductor 242 with first and second ends 242a, 242b.

The first end 228a of the inner conductor 228 of the third unit 206 is electrically connected in series to the first end 232a of the inner conductor 232 through a capacitor $C_7$. The first end 230a of the outer conductor 230 is electrically connected in series to the first end 234a of the outer conductor 234 through a capacitor $C_8$. The second end 230b of the outer conductor 230 is electrically connected in series to the second end 232b of the inner conductor 232 through a capacitor $C_9$. The second end 228b of the inner conductor 228 is electrically connected in series to the second end 242b of the outer conductor 242 of the lower section 208b of the fourth unit 208 through a capacitor $C_{10}$. The second end 234b of the outer conductor 234 is electrically connected in series to the second end 236b of the inner conductor 236 of the upper section 208a of the fourth unit 208 through a capacitor $C_{11}$. The second end 238b of the outer conductor 238 is electrically connected in series to the second end 240b of the inner conductor 240 through a capacitor $C_{12}$. The first end 236b of the inner conductor 236 is electrically connected in series to the first end 240a of the inner conductor 240 through a capacitor $C_{13}$. The first end 238a of the outer conductor 238 is electrically connected in series to the first end 242a of the outer conductor 242 through a capacitor $C_{14}$.

In operation, a magnetic field is generated between the third unit 206 and the fourth unit 208. The fourth unit 208, which has a smaller diameter than the third unit 206, reflects the magnetic field towards the third unit 206. The first and second units 202, 204 act as receiver coils and resonators within the magnetic field created by the third and fourth units.

Figure 15:
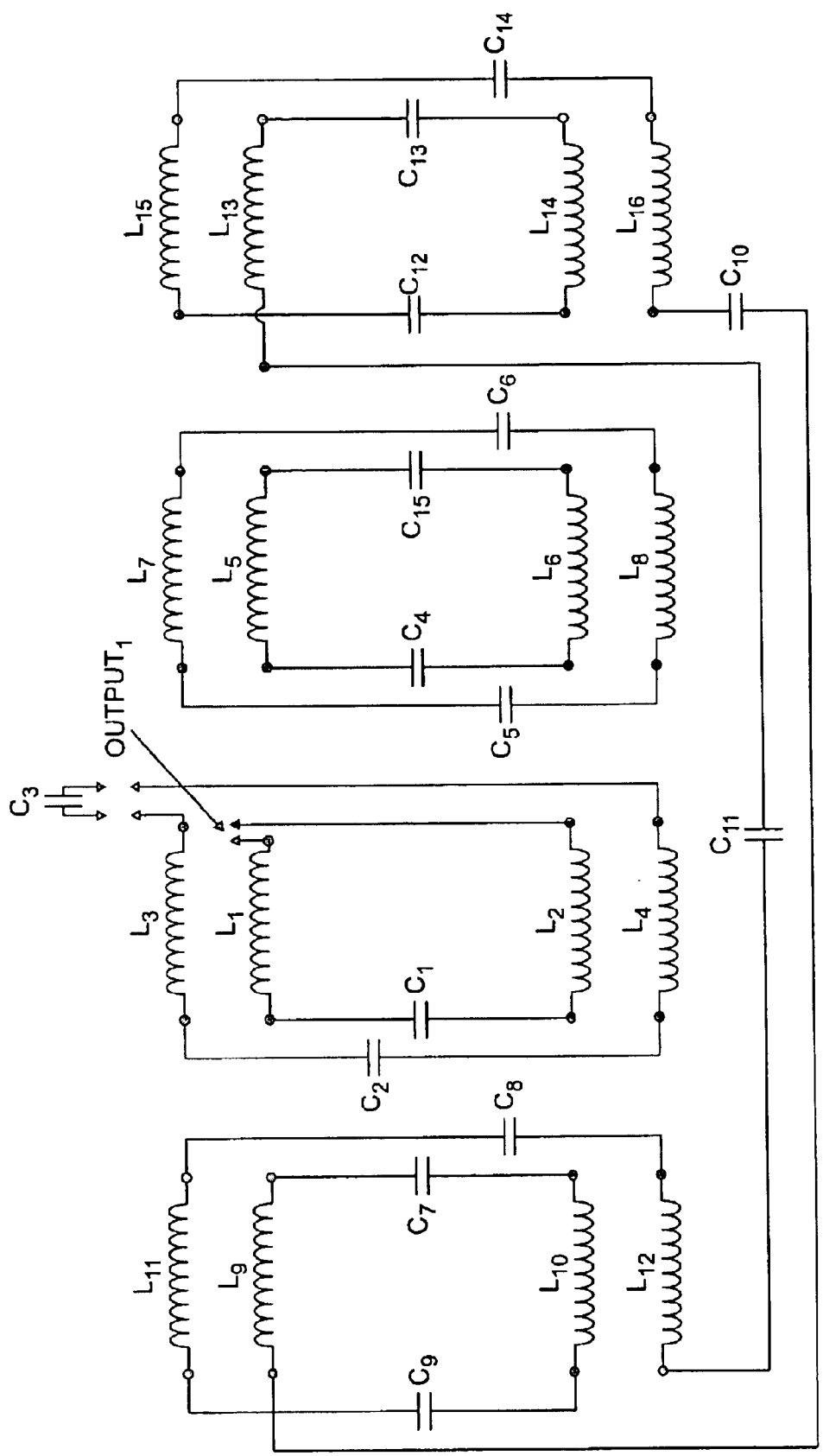
FIG. 15 is a schematic diagram of a circuit corresponding to the antenna array of FIG. 11.

FIG. 15 is a corresponding circuit diagram of the coaxial cable units of FIG. 11. The inductors of FIG. 13 correspond to the inner and outer conductors of FIG. 11, as follows:

| | |
|---|---|
| $L_1$ | Inner Conductor 210 |
| $L_2$ | Inner Conductor 216 |
| $L_3$ | Outer Conductor 214 |
| $L_4$ | Outer Conductor 218 |
| $L_5$ | Inner Conductor 220 |
| $L_6$ | Inner Conductor 224 |
| $L_7$ | Outer Conductor 222 |
| $L_8$ | Outer Conductor 226 |
| $L_9$ | Inner Conductor 228 |
| $L_{10}$ | Inner Conductor 232 |
| $L_{11}$ | Outer Conductor 230 |
| $L_{12}$ | Outer Conductor 234 |
| $L_{13}$ | Inner Conductor 236 |
| $L_{14}$ | Inner Conductor 240 |
| $L_{15}$ | Outer Conductor 238 |
| $L_{16}$ | Outer Conductor 242 |

The corresponding capacitors in FIGS. 11 and 13 are commonly identified.

In one configuration of the head and neck antenna array 200 for the use in an MRI system with a magnet with a field strength of between about 6,000 Gauss to about 8,000 Gauss, the capacitors $C_1$, $C_2$, $C_4$, $C_9$, $C_{11}$ and $C_{14}$ had a value of 220 picofarads ("pf"). Capacitor $C_3$ had a value of 470 pf and Capacitor $C_{10}$ had a value of 820 pf. The inner and outer conductors are preferably tuned to a frequency between about 25 to about 35 MHz. The first, second and third coaxial cable units 202, 204, 206 had an outer height "h1" (FIG. 13, FIG. 14) of about 11 inches. The fourth coaxial ring unit 208 had an outer diameter "D2" of about 9 inches. The distance "D" between adjacent coaxial cable units was 2 inches. (FIG. 14) Each coaxial cable unit was critically coupled to an adjacent coaxial cable unit. Such an antenna array 200 was found to have a Q of about 220 and a S/N ratio of about 360 to 1.

When positioned over the head of a patient, the third unit 204 is preferably positioned over the eyes of the patient.

The antenna array 200 may be encased in a base 200a of rigid dielectric material, as discussed above with respect to FIG. 13.

Figure 16:
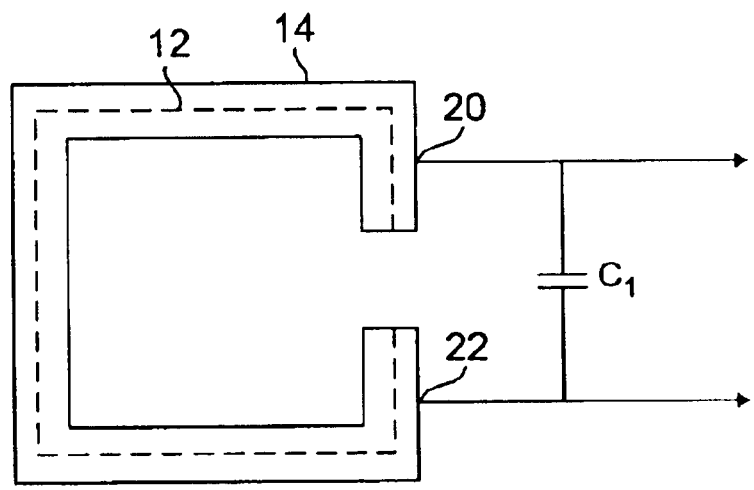
FIGS. 16–18 show coaxial cable units in various test configurations.
Figure 17:
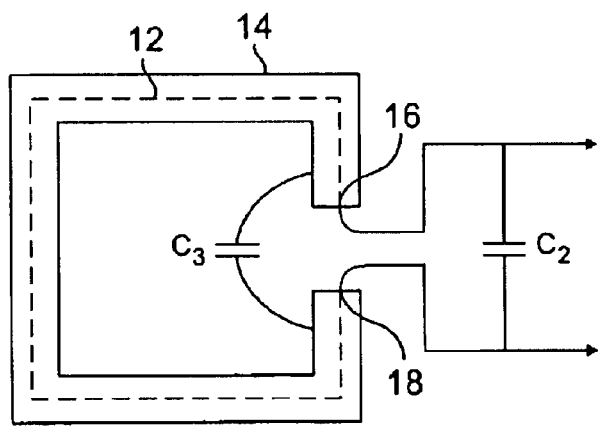

Testing of several of the configurations discussed above show significant improvements in Q and S/N ratio. The Q of the antenna may be measured by a network analyzer, such as the 3577A, available from the Hewlett Packard Company. The S/N ratio may be measured by performing a phantom scan by an MRI system, as is known in the art. In one test, the ends 20, 22 of an outer conductor 14 were electrically connected in series across a variable capacitor $C_1$, as shown in FIG. 16. The range of the variable capacitor $C_1$ was from 0 to about 30 picofarads. The outer conductor was tuned to a frequency between 25 to 35 MHz. The Q and S/N ratio of the coaxial cable in FIG. 16 were found to be 59 and 180, respectively. In FIG. 17, the ends 16, 18 of the inner conductor 12 were connected across the variable capacitor $C_1$, and the ends 20, 22 of the outer conductors were connected across a capacitor $C_2$ having a value of 10 picofarads. The inner and outer conductors 12, 14 were tuned to the frequency of between about 25 to 35 MHz. The Q of the circuit was 72 and the S/N ratio was 220, approximately a 22% improvement in both characteristics. The use of multiple coaxial cable units has been found to further improve the Q and S/N ratio of the antenna. As mentioned above, the Q of the hand, wrist and toe antenna array 100 of FIG. 10, for example, was found to be about 197, about a 233% improvement. The S/N ratio was found to be about 320, about an 82% improvement.

Figure 18:
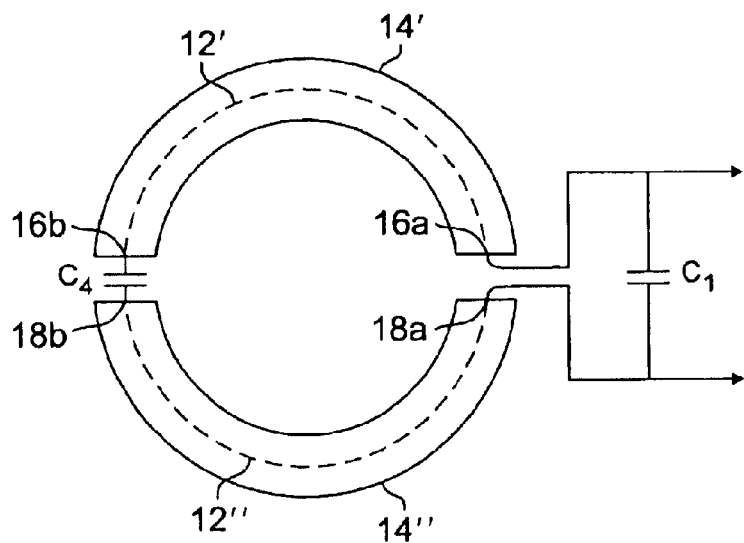
Figure 19:
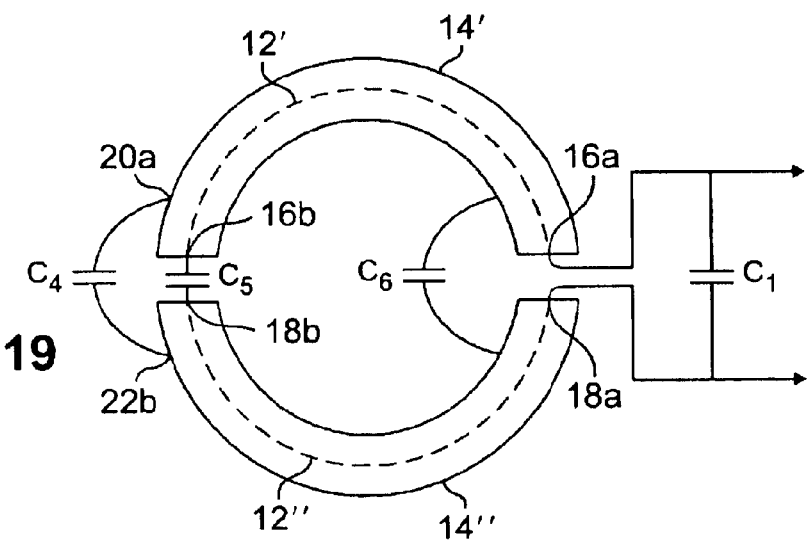
FIG. 19 shows a test configuration of a coaxial cable unit of the present invention.

When only the inner ends 16, 18 of the conductor 12 of a coaxial cable unit were connected across the capacitor $C_1$ and a capacitor $C_3$ of 120 picofarads, and the inner conductor was tuned to a frequency between about 25 to 35 MHz, as in FIG. 18, the Q of the circuit 28 was 103. The S/N ratio was 160. In the configuration of FIG. 19, the ends 16, 18 of the inner conductor 12 and the ends 20, 22 of the outer conductor 14 were connected through capacitors $C_1$, $C_4$, $C_5$ and $C_6$, respectively. The capacitors $C_4$=72 pf, the capacitor $C_5$=68 pf and the capacitor $C_6$=47 pf. Both conductors were tuned to a frequency between about 25 to 35 MHz. The Q of the circuit was 128 and the S/N ratio was 200 to 1, approximately a 25% improvement. As mentioned above, the use of multiple coaxial cables further improves the Q and S/N of the antenna. The Q of the head antenna array 200, with four coaxial cables, was 220, about a 113% improvement over the configuration of FIG. 18. The S/N ratio was 360 to 1, about a 125% improvement.

The basic coaxial cable unit 10 of FIG. 1 may also be used in antennas in other configurations, in accordance with the present invention. For example, in FIG. 20, an antenna array 400 comprises two concentric coaxial cable units 402 and 404, lying in the same plane. The inner coaxial cable unit 402 comprises an inner conductor 406 and an outer conductor 408. The inner conductor 406 has a first end 414 and a second end 418. The outer coaxial cable unit 404 comprises an inner conductor 410 and an outer conductor 412. The inner conductor 410 has a first end 416 and a second end 420. The outer conductor 412 has a first end 422 and a second end 424.

The first end 414 and the second end 418 of the inner conductor 406 of the inner coaxial cable unit 402 are electrically connected in parallel to the first end 416 and the second end 420, respectively, of the inner conductor 410 of the outer coaxial cable 404. A capacitor $C_1$ is electrically connected in parallel to the inner conductors 406 and 410.

The first end 422 of the outer conductor 412 is electrically connected to the second end 424 of the outer conductor 412, through a capacitor $C_2$. A portion 408a of the outer conductor 408 of the inner coaxial cable unit 402 is also directly electrically connected to an adjacent portion 412a of the outer conductor 412 and a portion 408b of the outer conductor 408 is directly electrically connected to a portion 412b of the outer conductor 412b, through electrical contacts 411, 413, respectively. Insulation (not shown) may be provided between the outer conductors 408 and 412 along the remainder of their lengths.

The inner conductors 406, 410 of the two coaxial cables 402, 404 provide the output of the antenna 400. The capacitor $C_1$ may be connected to a variable capacitor in the preamplifier of the MRI system, or be the variable capacitor of the preamplifier.

As above, the values of the capacitors $C_1$ and $C_2$ are such that the circuit including the inner conductors and the circuit including the outer conductors, are tuned to the same Larmor frequency.

Figure 20:
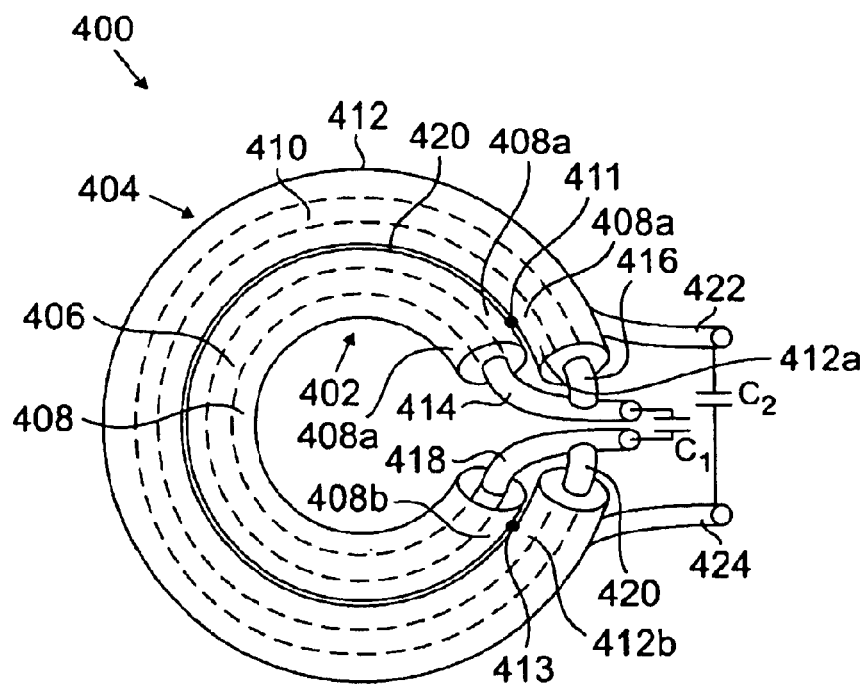
FIG. 20 shows an antenna array comprising two concentric coaxial cable units lying in the same plane.
Figure 21:
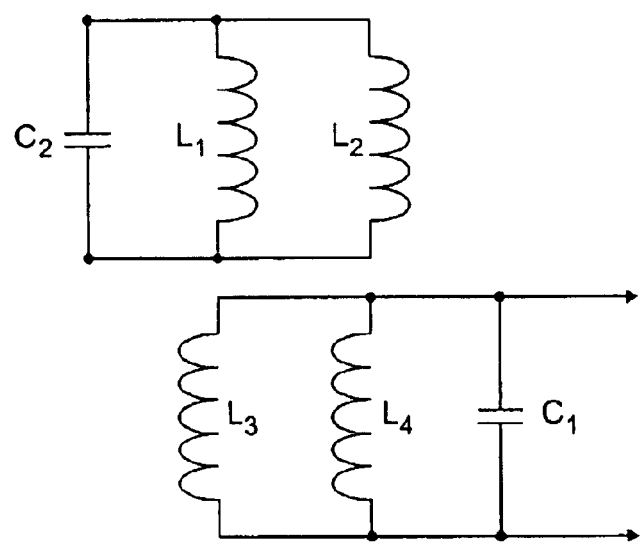
FIG. 21 is a schematic diagram of a circuit corresponding to the configuration of FIG. 20.

FIG. 21 is an schematic diagram of a circuit corresponding to the configuration of FIG. 20, wherein the inductor $L_1$ represents the outer conductor 412 of the outer coaxial cable unit 404 and the inductor $L_2$ represents the outer conductor 408 of the inner coaxial cable unit 402. The inductor $L_3$ represents the inner conductor of 410 of the outer coaxial cable unit 404 and the inductor $L_4$ represents the inner conductor 406 of the inner coaxial cable unit 402.

Figure 22:
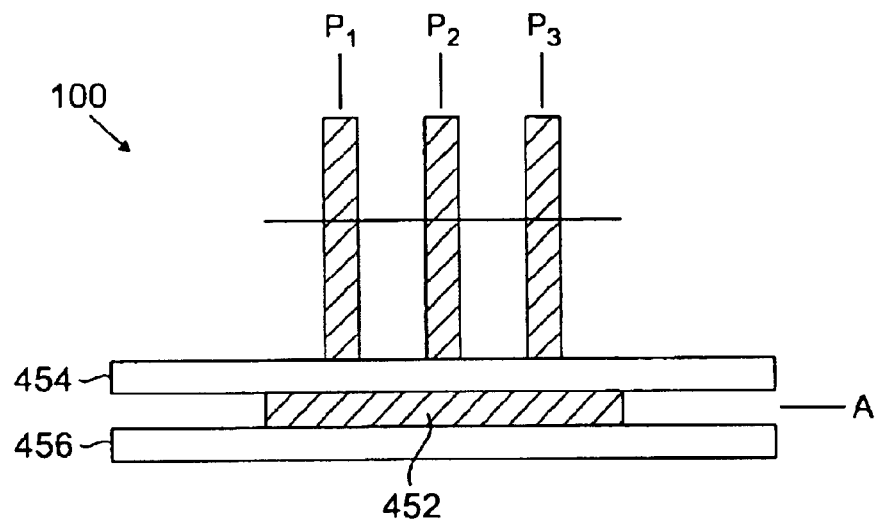
FIG. 22 shows a quadrature antenna system comprising the hand, wrist and toe antenna array of FIGS. 9–12 and a pair of rectangular coaxial cable units.
Figure 23:
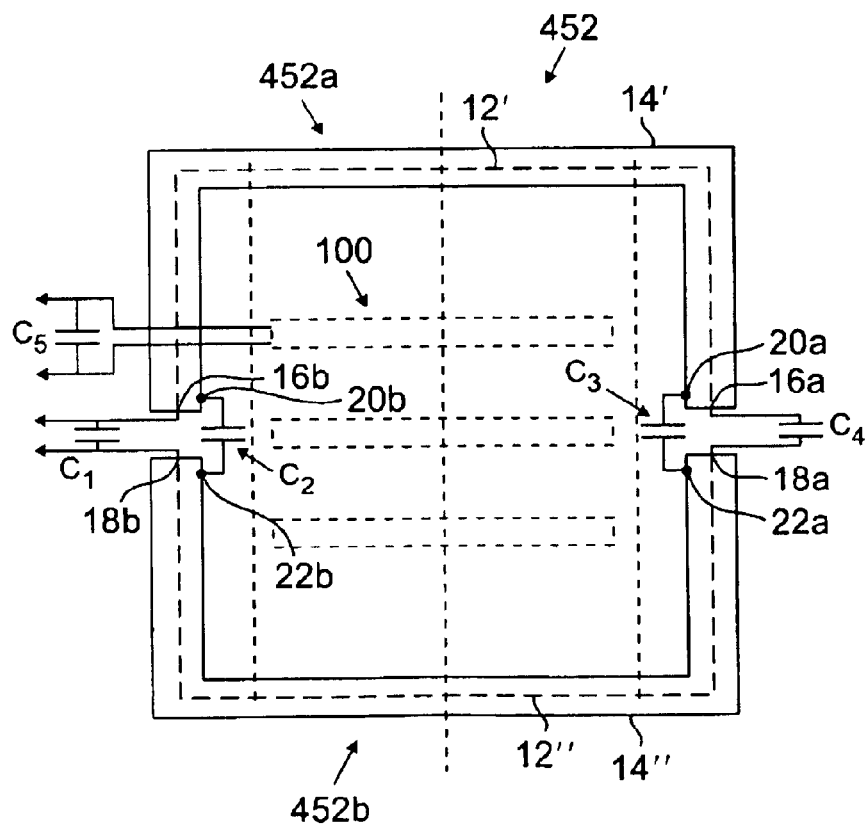
FIG. 23 is a top view of the quadrature antenna system of FIG. 22, showing the rectangular coaxial cable units.

The antennas and antennas arrays of the present invention may also be used in a quadrature arrangement. For example, in FIG. 22, a quadrature antenna system 450 is shown comprising the hand, wrist and toe antenna array 100 of FIGS. 9–12 and a pair of rectangular coaxial cable units 452a, 452b. FIG. 23 is a top view of the antenna arrays 100 and 452, showing the rectangular coaxial cable unit 452. In FIG. 23, the rectangular coaxial cable coil 452 lies in a flat plane A of the page. In FIG. 22, the flat plane A is perpendicular to the page and is perpendicular to the parallel planes $P_1$, $P_2$, $P_3$, of the antenna array 100.

In FIG. 22, the antenna array 100 and the rectangular or coaxial cable 452 are separated by a dielectric material 454, such as plastic. The dielectric material 454 may be in the form of a plate. The rectangular coaxial cable 452 may also be supported by a plate 456 of plastic or other dielectric material. The plates 502, 503 may be 1 inch thick, for example.

Returning to FIG. 23, the rectangular coaxial cable unit 452 preferably includes two sections 452a and 452b to lower the inductance of the coaxial cable 452. The two sections 452a, 452b each have an inner conductor 12', 12", and an outer conductor 14', 14", as in FIG. 7. Opposing ends 16a, 18a and 16b, 18b of the inner conductors 12' and 12" are connected to each other through capacitors $C_1$ and $C_4$, while the opposing ends 20a, 22a and 20b, 22b of the outer conductors 14' 14", are connected to each other through capacitors $C_2$, $C_3$. The output of the rectangular coaxial cable unit 452 is across the capacitor $C_1$. As above, the capacitor $C_1$ may be connected to a varactor in the preamplifier of the MRI system or may be the varactor in the preamplifier.

A capacitor $C_5$ is connected across the output 108 of the antenna array 100 (see FIG. 9). The details of the connections of the inner and outer conductors of each coaxial cable unit of the array 100, and of the output across the capacitor $C_5$, are not shown in FIG. 23. As above, the capacitor $C_5$ may also be connected to or be a varactor in the preamplifier of the MRI system.

Figure 24:
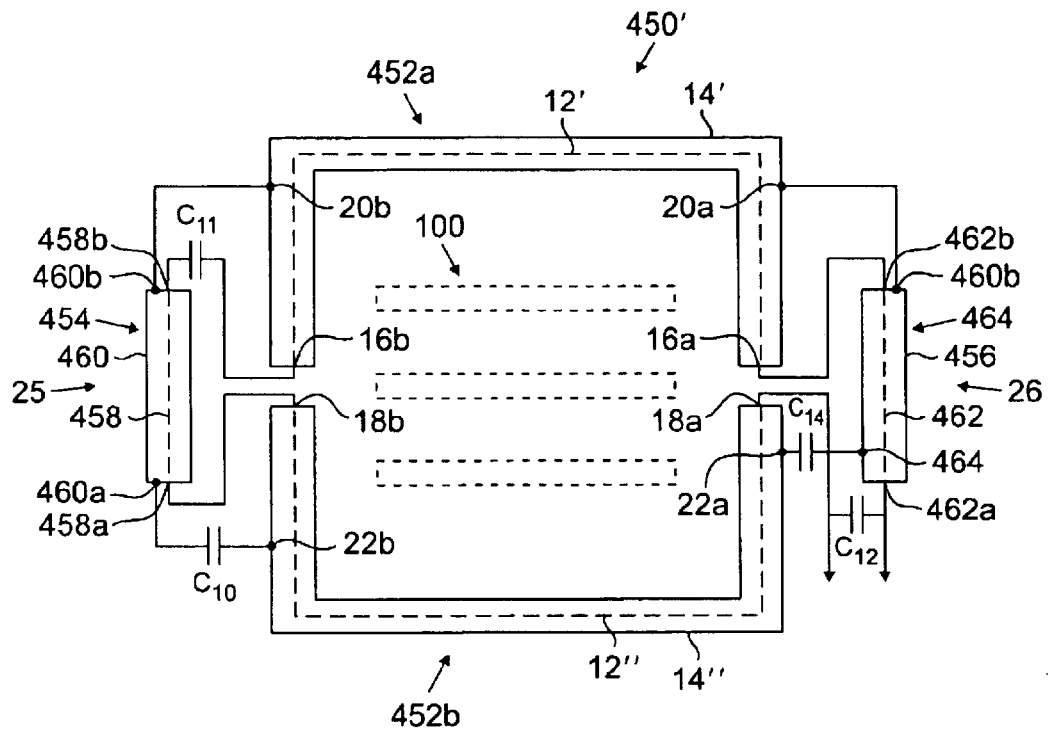
FIG. 24 shows a quadrature antenna system of FIG. 23, including additional coaxial cable units coupled to the rectangular coaxial cable units.
Figure 25:
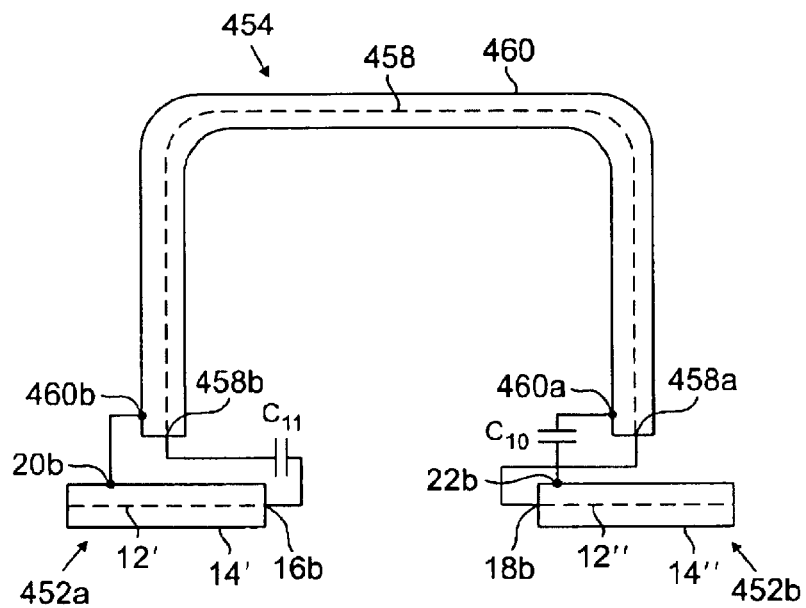
FIG. 25 is a side view of the quadrature antenna system of FIG. 24, along line 25—25 in FIG. 24.
Figure 26:
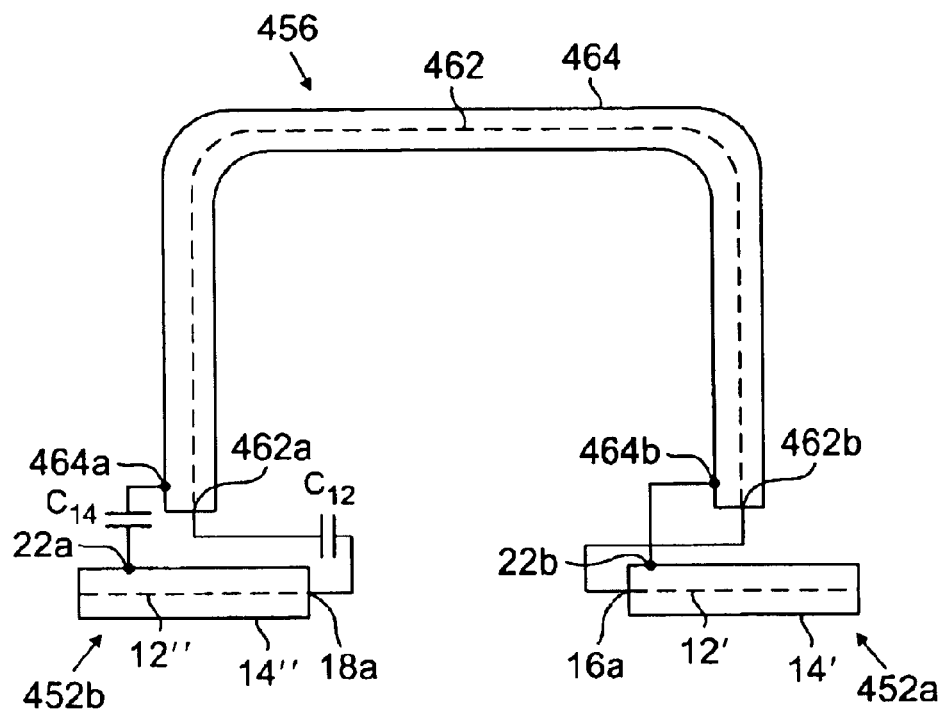
FIG. 26 is a side view of the quadrature antenna system of FIG. 24, along line 26—26 of FIG. 25.

The range of the rectangular coaxial cable units 452a, 452b may be extended by providing additional coaxial cable units 454, 456, perpendicular to the coaxial cable units 452a, 452b. FIG. 24 shows a quadrature antenna system 450' of FIG. 23, which includes additional coaxial cable units 454, 456. The coaxial cable unit 454 includes an inner conductor 458 and an outer conductor 460. The coaxial cable unit 456 includes an inner conductor 462 and an outer conductor 464. FIG. 25 is a side view of the quadrature antenna system 450, along line 25 in FIG. 26. FIG. 26 is a side view of the quadrature antenna system 450, along arrow 26 in FIG. 26. The height "h" of the coaxial cable units 454, 456 may be 4 inches, for example. The antenna array 100 is not shown in FIGS. 25 and 26.

As shown in FIGS. 24 and 25, a first end 460a of the outer conductor 460 of the coaxial cable unit 454 is connected to the second end 22b of the inner conductor 12" of the coaxial cable unit 452b through a capacitor $C_{10}$. The first end 458a of the inner conductor 458 is directly connected to the first end 18b of the outer conductor 14".

The second end 460b of the outer conductor 460 is directly connected to the second end 20b of the coaxial cable unit 452a. The second end 16b of the inner conductor 12' of the coaxial cable unit 452a and the second end 458b of the inner conductor 458 of the coaxial cable unit 454 are connected across a capacitor $C_{11}$.

As shown in FIGS. 24 and 26, a first end 462a of the inner conductor 462 of the coaxial cable unit 456 is connected to the first end 18a of the inner conductor 12" of the coaxial cable unit 452b through a capacitor $C_{12}$. The second output of the quadrature antenna system is provided across the capacitor $C_{12}$. The first end 464 of the outer conductor 464a is connected to the second end 22a of the outer conductor 14" through a capacitor $C_{14}$.

The second end 462b of the inner conductor 462 is directly electrically connected to the first end 16a of the inner conductor 12' of the coaxial cable unit 452a. The second end 464b of the outer conductor 464 is directly connected to the first end 20a of the outer conductor 14'.

The connections within the antenna array 100 are the same as in FIG. 23 and FIG. 9.

Figure 27:
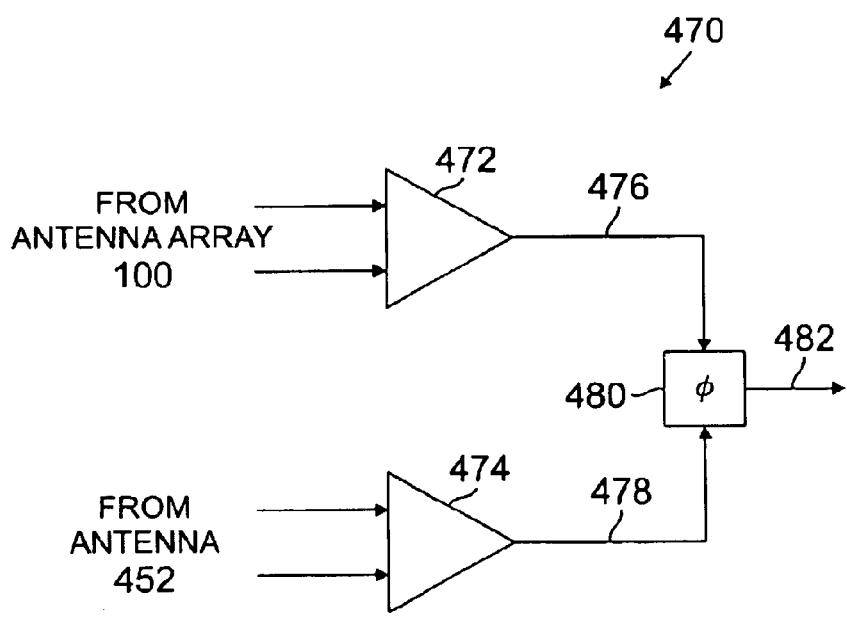
FIG. 27 is a schematic diagram of the preamplifier section of an MRI system for use with the quadrature antenna system of FIGS. 22–26.

FIG. 27 is a schematic diagram of the preamplifier section 470 of an MRI system for use with the quadrature antenna systems 100 and 452. Two preamplifiers 472, 474 are shown, each providing an input 476, 478 to a phase shifter signal combiner 480, which provides an output 482 to the signal processing portion of an MRI system. The output from the antenna array 100 may be provided to the preamplifier 472 and the output from the rectangular coaxial cable antenna 452 may be provided to the preamplifier 472 for example. The phase shifter may be a Mini-Circuit 15542 ZSCQ-2-50, available from Mini-Circuit, Brooklyn, N.Y., for example.

Figure 28:
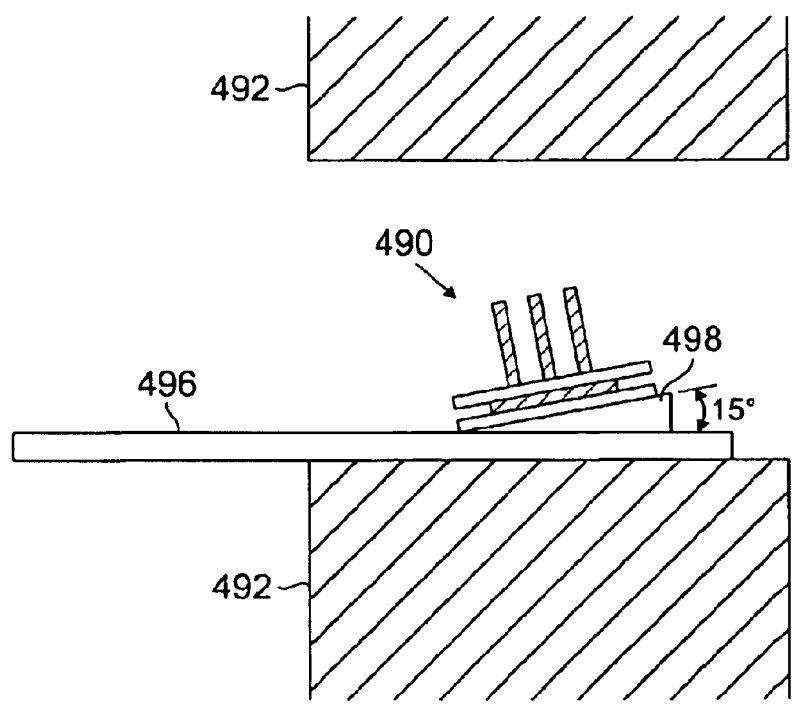
FIG. 28 is a side view of the gap between the magnet poles of an MRI system.

FIG. 28 is a side view of the gap 490 between the magnet poles 492, 494 of an MRI system, such as the Quad 7000 available from FONAR, Corporation, Melville, N.Y. The quadrature antenna system 450 rests on a patient bed 496 portion of which is above the pole 494. Preferably, the quadrature antenna system 450 is supported at an angle with respect to the patient bed 496. An angle of about 15° may be provided, for example. The quadrature antenna system 450 may be supported at an angle by a wedge 498, for example.

The head and neck antenna array 200 may also be used in a quadrature arrangement by adding a coaxial cable unit perpendicular to the planes of the coaxial cable units of the antenna array 200, above or below the antenna array.

It is known that the voltage induced in a secondary winding of a transformer may be increased by increasing the number of turns in the secondary winding. The voltage induced in the inner conductor of the coaxial cable unit 10 of FIG. 1 may therefore be increased by connecting a plurality of inner conductors in series. The signal-to-noise (S/N) ratio is thereby improved. However, it is also known that connecting inductors in series increases the resistance of the circuit, decreasing the Q of the circuit. In addition, the inductance is also increased, preventing tuning of the circuit to high frequencies for use with magnets of high field strengths, as discussed above. Therefore, it is preferred to also provide inner conductors connected in parallel, to lower the resistance and inductance of the circuit including the inner conductors. Parallel connection also increases current flow, which also improves the signal-to-noise (S/N) ratio.

Figure 29:
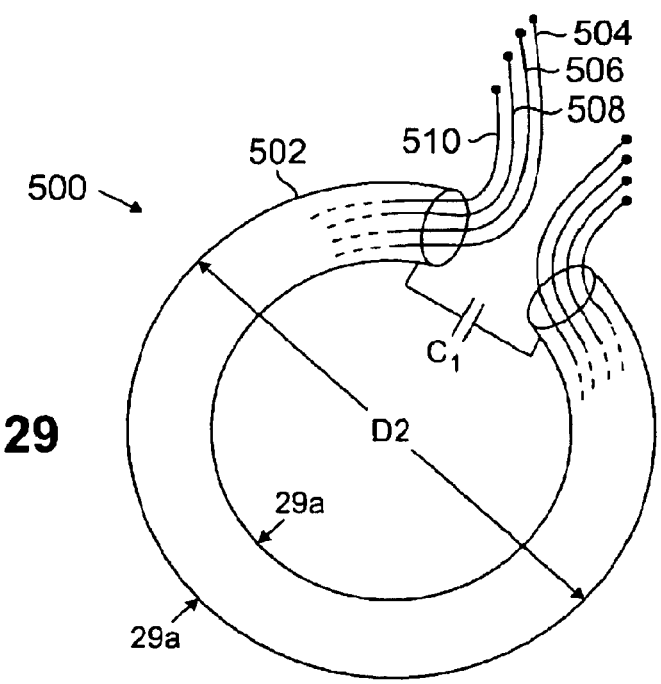
FIG. 29 is a plan view of a coaxial cable unit in accordance with another embodiment of the invention, including four inner conductors.
Figure 29A:
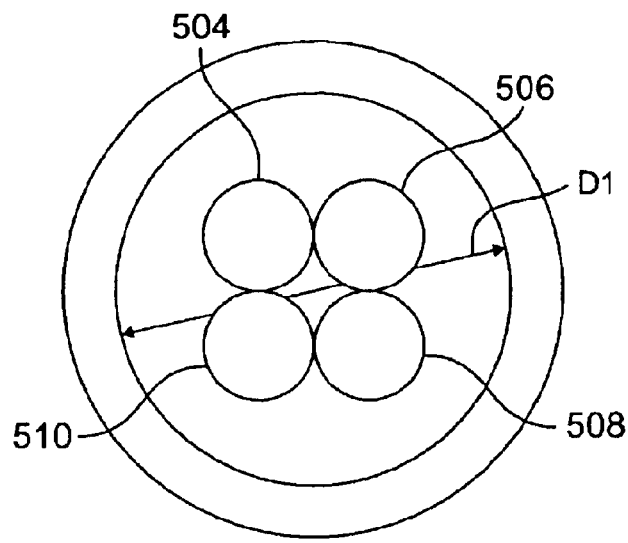
FIG. 29a is a cross-sectional view of the coaxial cable unit of FIG. 29, along line 29—29.

FIG. 29 is a plan view of a coaxial cable unit 500 in accordance with another embodiment of the invention, including multiple inner conductors. In the configuration of FIG. 29, four inner conductors 504, 506, 508, 510 are shown. More or fewer inner conductors may be provided. FIG. 29a is a cross-sectional view of the coaxial unit 500 along line 29a—29a in FIG. 29. Preferably, the inner conductors 504, 506, 508, 510 are closely and tightly bundled by slightly twisting them together. The inner conductors may be solid and are covered by a dielectric material, such as Teflon tubing (not shown).

The ends 502a, 502b of the outer conductor are connected across a capacitor $C_1$, as shown in FIG. 29.

Figure 30:
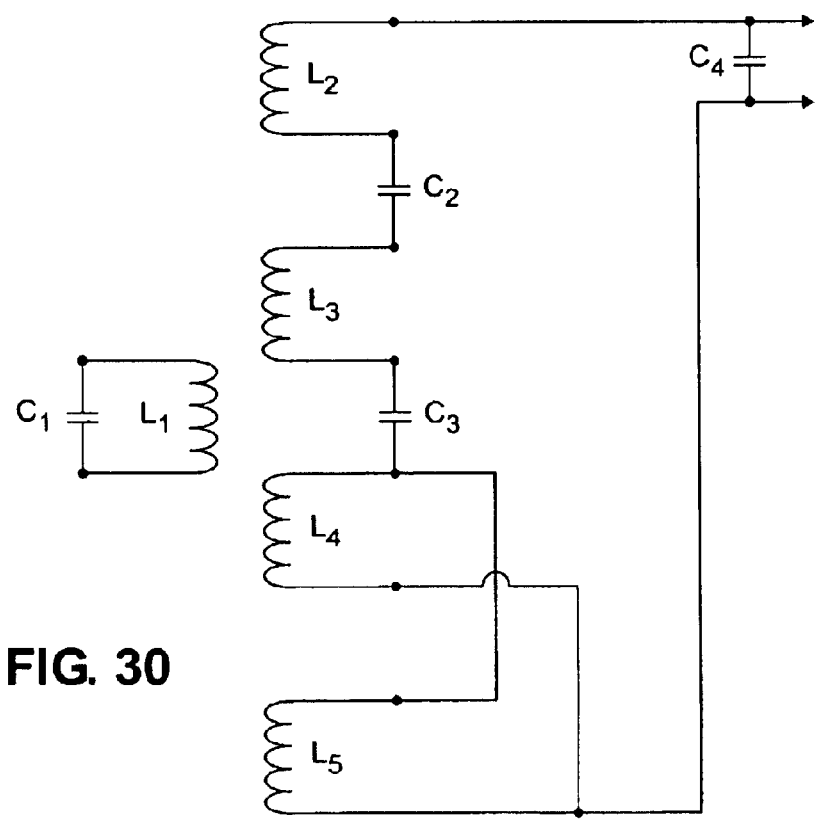
FIG. 30 shows a preferred connection scheme for the inner conductors of the configuration of FIG. 29.

A preferred connection scheme for the inner conductors is shown in FIG. 30, where the inductors $L_2$, $L_3$, $L_4$ and $L_5$ correspond to the inner conductors, 504, 506, 508, 510, respectively. The inductors $L_2$ and $L_3$ are preferably connected in series through capacitor $C_2$. The inductor $L_3$ and the inductor $L_4$ are also preferably connected in series, through a capacitor $C_3$. The inductors $L_4$ and $L_5$ are preferably connected in parallel. The parallel connector inductors $L_4$, $L_5$ are electrically connected to the inductor $L_3$ though a capacitor $C_3$. The resistance and inductance are not, therefore, increased as much as if all of the inductors were connected in series.

The circuit including the outer conductor and the circuit including the inner conductor are tuned to the same Larmor frequency, as discussed, above. As above, the capacitor $C_4$ may be connected to a varactor in the preamplifier of the MRI system or may be the varactor.

Figure 31:
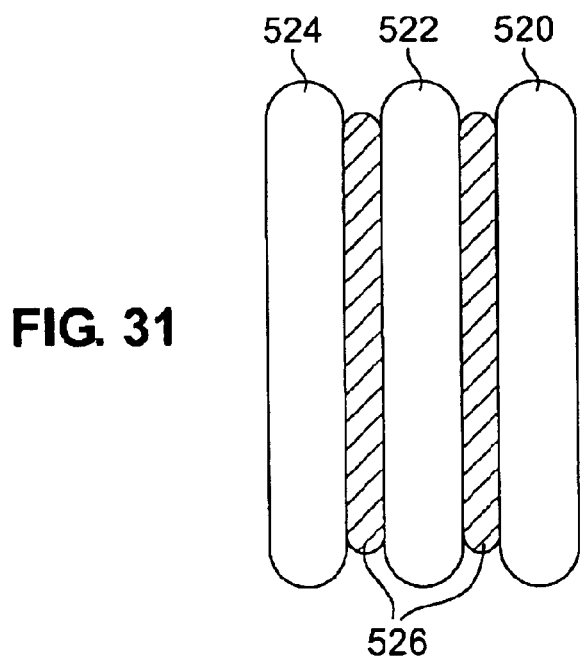
FIG. 31 shows three coaxial cable units as in FIG. 29, separated by an insulator.
Figure 33:
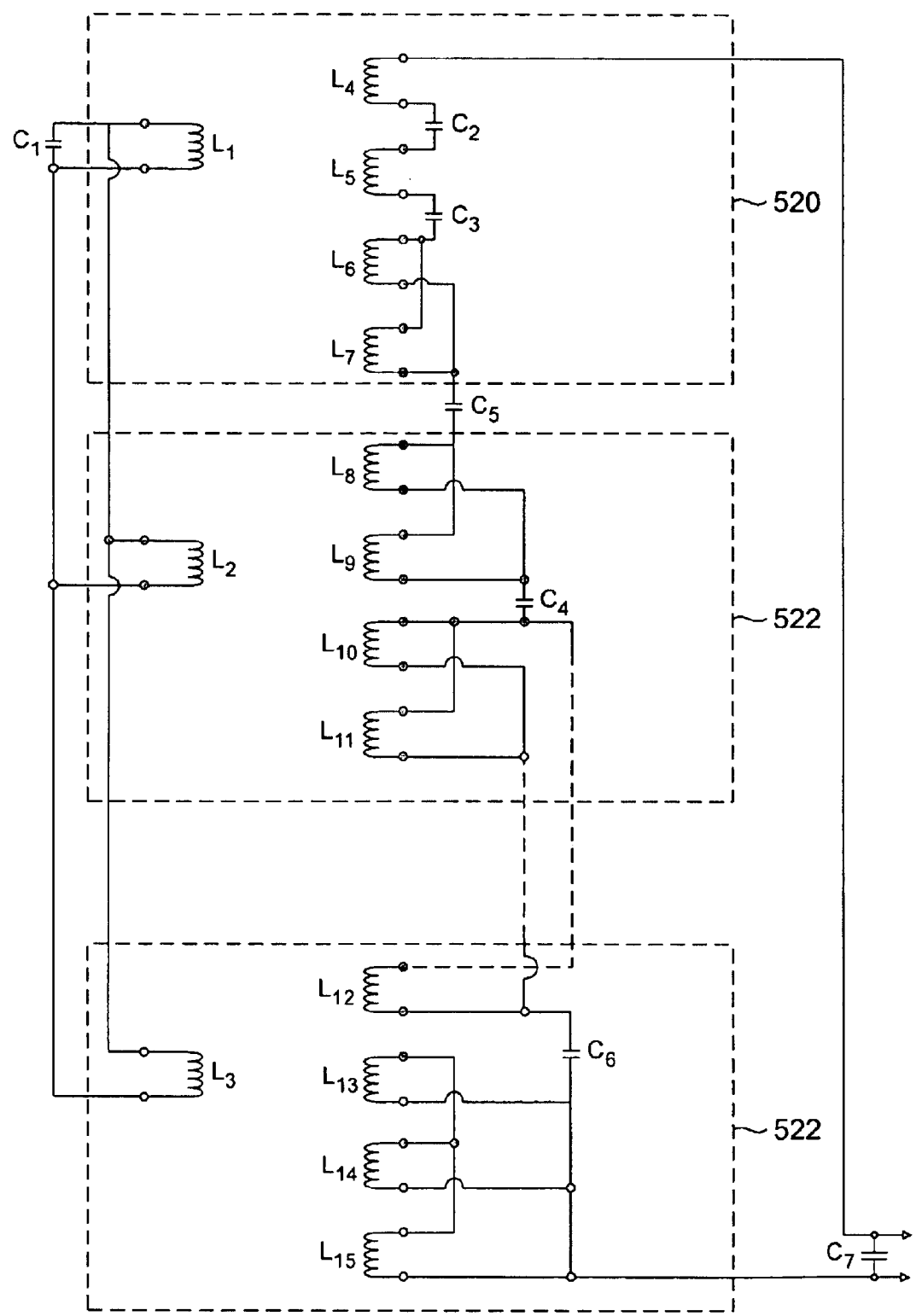
FIG. 33 is a schematic diagram of a circuit corresponding to the antenna array of FIG. 31.

An antenna array may also be provided with multiple coaxial cable units 500. FIG. 31 shows three coaxial cable units 520, 522 and 524, separated by an insulator 526 such as Teflon®. Each coaxial cable 520, 522, 524, may be copper tubing with a diameter of about 0.25 inches. The Teflon® may be 1 mm thick, for example. FIG. 33 shows the three coaxial cable units 520, 522, 524 and the connections between their inner and outer conductors. Those connections will be explained with respect to the electrical schematic diagram of FIG. 33, wherein the top box corresponds to the coaxial cable unit 520, the middle box corresponds to the coaxial cable unit 522 and the lower box corresponds to the coaxial cable unit 524.

The outer conductors of each coaxial cable unit 520, 522, 524 are represented as inductors $L_1$, $L_2$ and $L_3$, respectively, in FIG. 33. The inductors $L_1$, $L_2$ and $L_3$ are preferably connected in parallel across a capacitor $C_1$. The parallel connection of the outer conductors provides better shielding of the inner conductors. Alternatively, the outer conductors may be connected in series.

In the coaxial cable unit 520, two of the inner conductors are preferably connected in series and two are preferably connected in parallel. In FIG. 33, the inductors $L_4$, $L_5$, $L_6$ and $L_7$ represent the four inner conductors of the first coaxial cable unit 520. The two inductors $L_4$ and $L_5$ are connected in series across a capacitor $C_2$. The two inductors $L_6$ and $L_7$ are connected in parallel. The parallel connected inductors $L_6$, $L_7$ are connected to the inductor $L_5$ through a capacitor $C_3$.

In the second coaxial cable unit 522, two pairs of the inner conductors are connected in parallel. In FIG. 33, the inner conductors are represented by the inductors $L_8$, $L_9$, $L_{10}$ and $L_{11}$, respectively. The inductors $L_8$ and $L_9$ are connected in parallel and the inductors $L_{10}$ and $L_{11}$ are connected in parallel. One pair ($L_8$, $L_9$) is connected to the other pair ($L_{10}$, $L_{11}$) across a capacitor $C_4$. The pair of parallel connected inductors ($L_6$, $L_7$) in the first coaxial cable unit is also connected to one of the pairs of parallel connected inductors ($L_8$, $L_9$) in the second coaxial cable unit 522 through a capacitor $C_5$.

Figure 32:
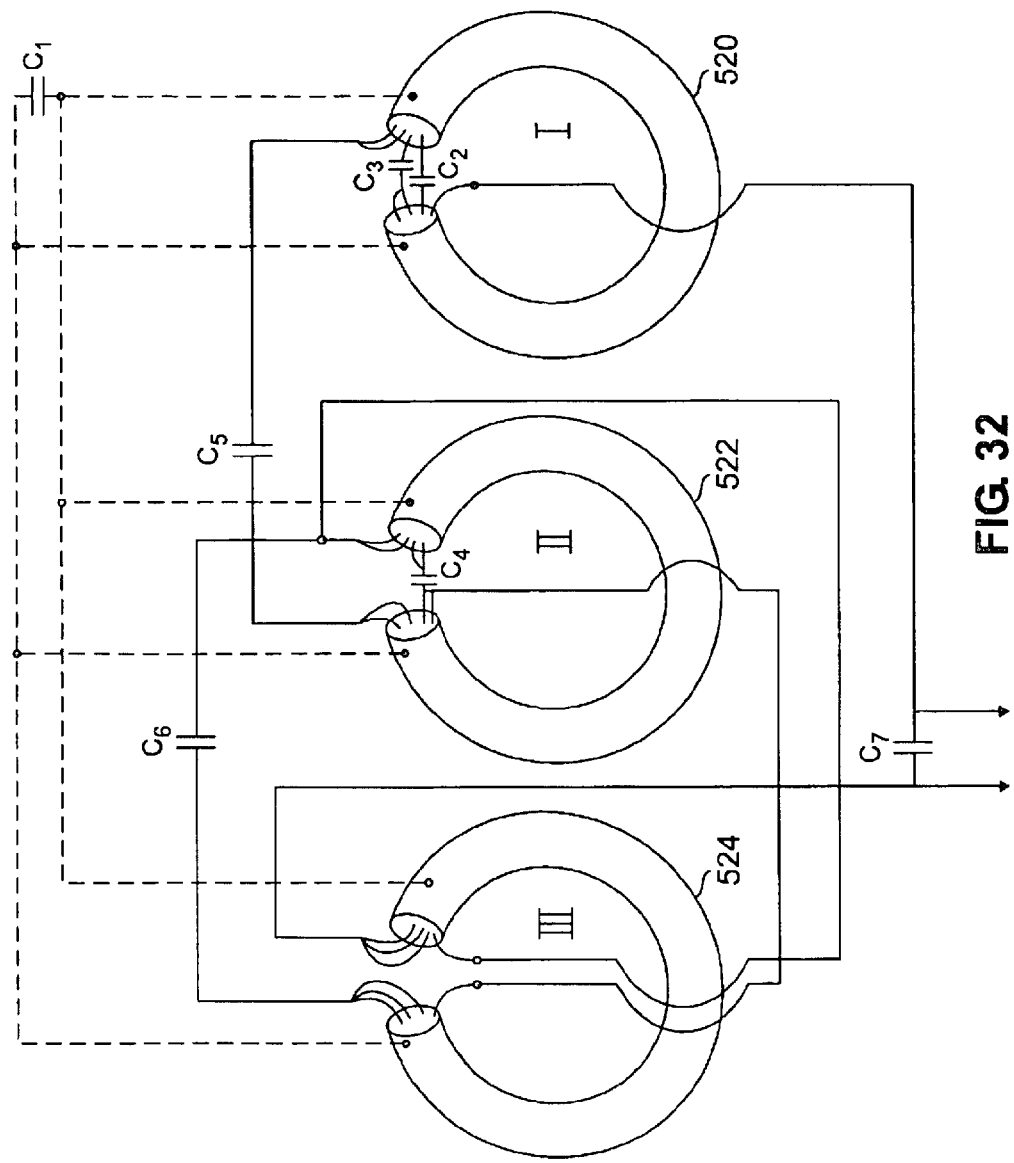
FIG. 32 shows the three coaxial cable units of FIG. 31 and preferred connections between their inner and outer conductors.

In the third coaxial cable unit 524, three of the inner conductors are preferably connected in parallel. In FIG. 33, the inner conductors are represented as the inductors $L_{12}$, $L_{13}$, $L_{14}$, and $L_{15}$, respectively. The inductor $L_{12}$ is connected to the three parallel connected inductors $L_{13}$, $L_{14}$, $L_{15}$ through a capacitor $C_6$. While the capacitor $C_6$ is shown within the box 524 representing the third coaxial cable unit 524, it is most readily provided between the second and third coaxial cable units 522, 524, as shown in FIG. 32. One of the pairs of parallel connected inductors ($L_{10}$, $L_{11}$) in the second coaxial cable unit 522 is also connected in parallel to a first one of the inductors $L_{12}$ in the third coaxial cable unit 524.

One end the first inductor $L_4$ of the first coaxial cable unit 520 and one end of the three parallel connected inductors $L_{13}$, $L_{14}$, $L_{15}$ in the third coaxial cable unit 524 are connected across a capacitor $C_7$ to provide an output of the antenna array. As discussed above, the capacitor $C_7$ may be connected to a varactor in the preamplifier of the MRI system or may be the varactor in the preamplifier.

As above, the circuit of the connected inner conductors is tuned to the same frequency as the circuit including the outer conductors. Such a configuration was found to have a signal-to-noise (S/N) ratio of about 700 and a Q of about 200.

The outer conductor 504 of the coaxial cable unit 502 may have an inner diameter "D1" of 0.25 inches, as shown in FIG. 29a. The outer diameter "D2" (FIG. 29) of the coaxial cable unit ring may be 6¾ inches, for example. Such a coaxial cable unit is appropriate for imaging a knee, for example. The inner conductors 504, 506, 508 and 510 may each have an outer diameter of 0.74 millimeters. As stated above, the inner conductors 504, 506, 508, 510 are preferably tightly bundled.

For coaxial cable units with diameters D1 (FIG. 29) of greater than about 8½ inches, or for use with high magnetic field strengths and higher Larmor frequencies, it is preferred to connect all of the inner conductors in parallel, to facilitate tuning. A parallel connection scheme is discussed below with respect to FIG. 36.

Figure 34:
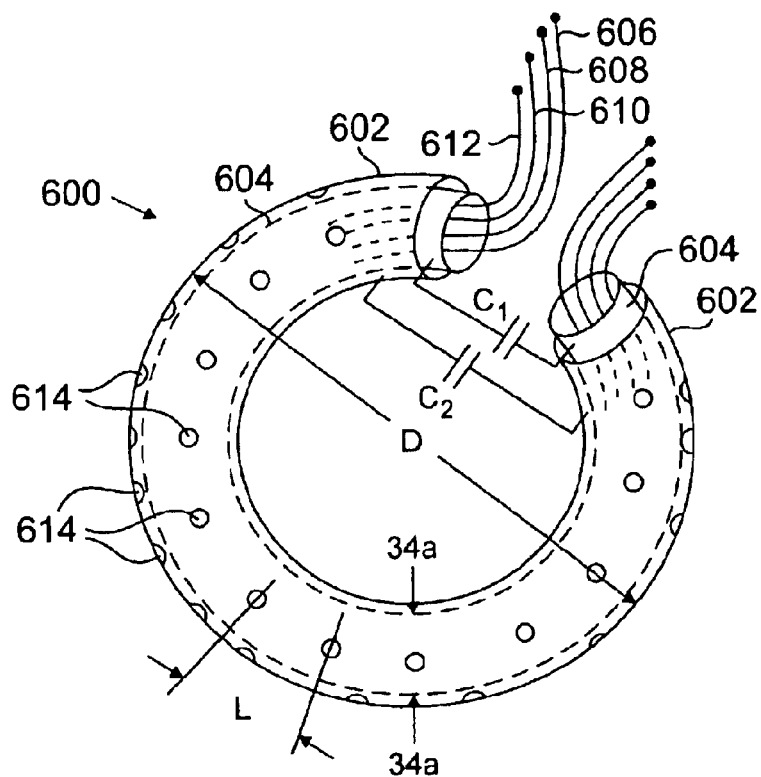
FIG. 34 shows a triaxial cable unit in accordance with another embodiment of the present invention.
Figure 34A:
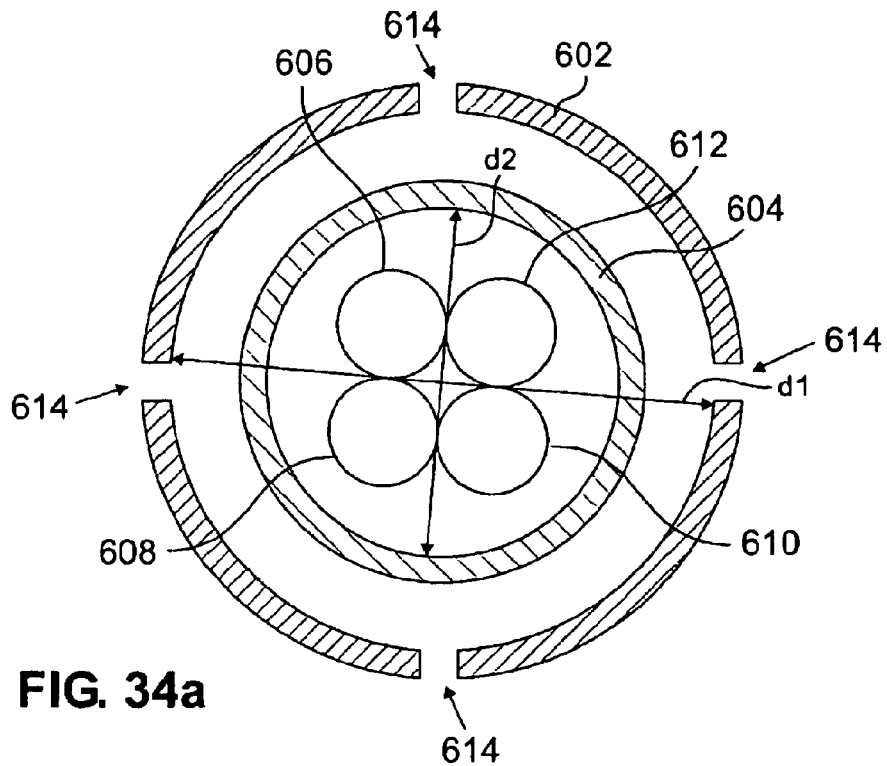

In another embodiment, an additional outer conductor may be added to the coaxial cable unit 500 of FIG. 29, forming a triaxial cable unit 600, as shown in FIG. 34. Two outer conductors 602, 604 are provided with multiple inner conductors 606, 608, 610, 612. The outermost, first outer conductor 602, which surrounds the second outer conductor 604, has openings 614 distributed around its periphery. FIG. 34a is a cross-sectional view of the triaxial cable unit 600 along line 34a—34a of FIG. 34, showing the various components.

Ends of the first outer conductor 602 are connected through a capacitor $C_2$. Ends of the second outer conductor 604 are also connected to each other through a capacitor $C_1$. The first and second outer conductors 602, 604 are both tuned to the Larmor frequency of the species of interest. Depending on the diameter D of the ring 600, and/or the magnetic field strength, the inner conductors 606, 608, 610, 612 are connected to each other as described above with respect to FIG. 30, or in parallel, as discussed below.

Figure 35:
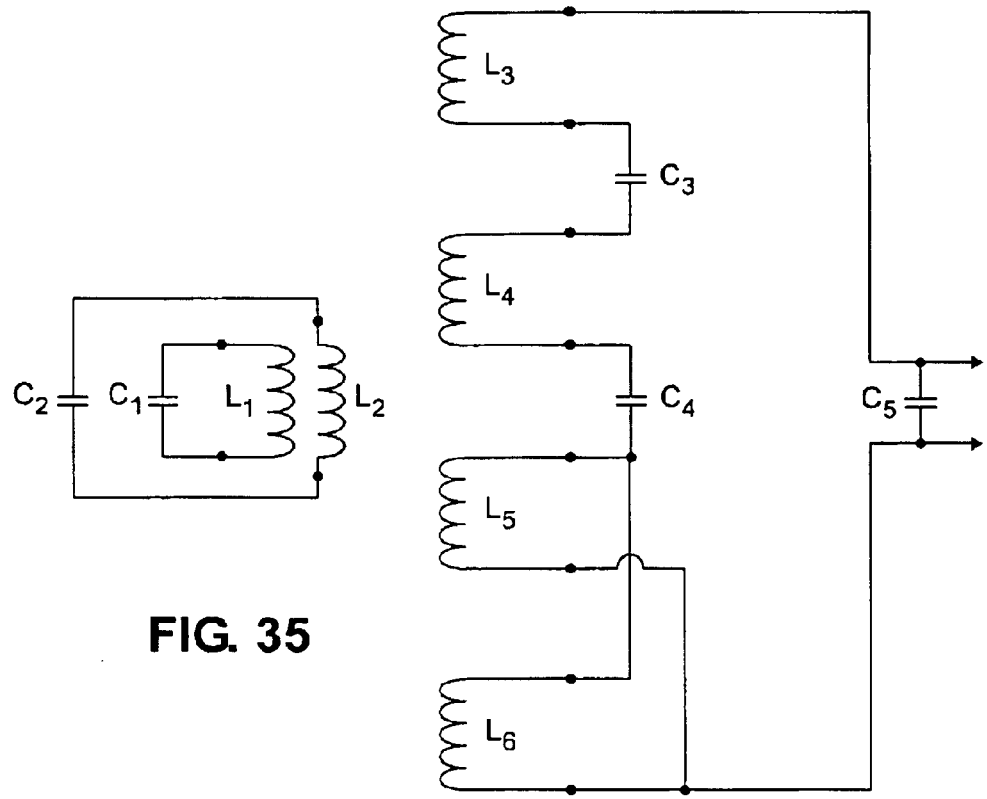
FIG. 35 is a schematic representation of the triaxial cable unit of FIG. 34.

FIG. 35 is a schematic representation of a circuit corresponding to the triaxial cable unit of FIG. 34, wherein the first outer conductor 602 is represented by the inductor $L_1$, the second outer conductor 604 is represented as the inductor $L_2$ and the inner conductors 606, 608, 610, 612 are represented as inductors $L_3$, $L_4$, $L_5$, $L_6$, respectively. As discussed above, ends of the outer conductors 602, 604 ($L_1$, $L_2$) are connected across the capacitors $C_1$, $C_2$, respectively. Two of the inner conductors 606, 608 ($L_3$, $L_4$) are connected in series and the other two inner conductors 610, 612 ($L_5$, $L_6$) are connected in parallel, as shown in FIG. 35.

Figure 36:
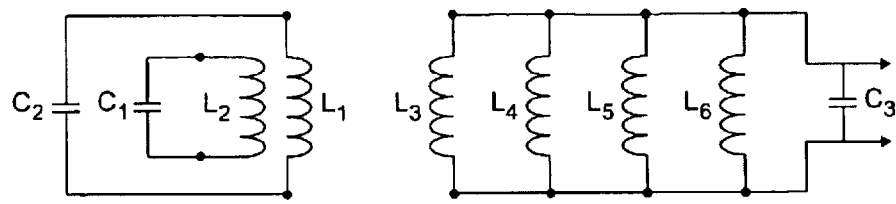
FIG. 36 is a schematic representation of the triaxial cable unit of FIG. 34, wherein the inner conductors are connected in parallel.

FIG. 36 is a schematic representation of the triaxial cable unit 600 of FIG. 34, wherein the inner conductors 606, 608, 610, 612 ($L_3$, $L_4$, $L_5$, $L_6$) are connected in parallel.

In one configuration, the triaxial cable unit ring has an inner diameter "D" of 8 inches. The inner diameter "d1" (FIG. 34a) of the first conductor is ⅜ inch. The inner diameter "d2" of the second conductor is ¼ inch. The holes 614 in the first conductor 602 have diameters of about 2 mm. and are separated by a length "L" of about 1 inch.

Because of the holes 614 through the first, outermost conduct 602, it is believed, without limiting the scope of the invention, that magnetic resonance signals are detected by both the first and second outer conductors 602 and 604, and that in addition, since the first and second outer conductors 602, 604 are inductively coupled, voltage signals which are a function of the magnetic resonance signals detected by the first outer conductor 602, are induced in the second outer conductor 604. The second outer conductor is also inductively coupled to the inner conductors 606, 608, 610, 612 and induces voltage signals in the inner conductors which are provided to the MRI system for processing. While the embodiment of FIGS. 34–36 has multiple inner conductors 504, 506, 508, 510, a second outer conductor 604 may be used in a triaxial cable with only one inner conductor.

Figure 37:
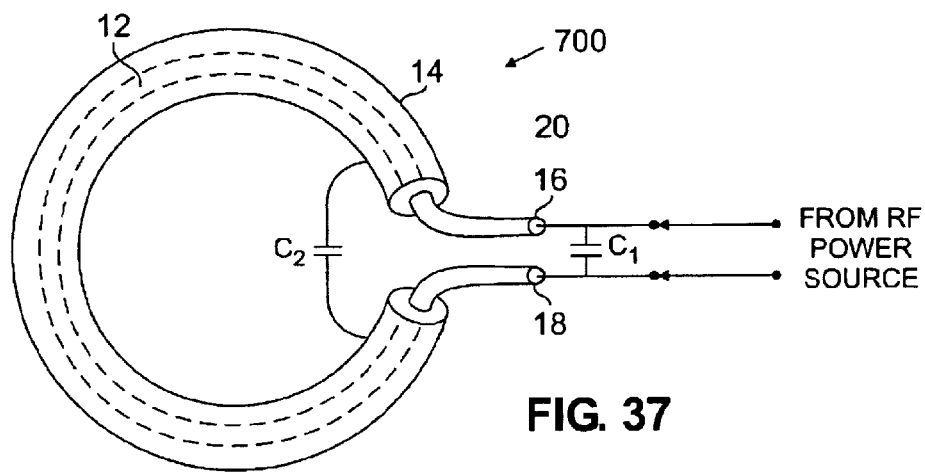
FIG. 37 shows a coaxial cable unit as in FIG. 3, wherein the ends of the inner conductor are connected across a capacitor to a radio frequency power source.

As mentioned above, the coaxial cable units of the present invention may also be used as transmitting antennas. FIG. 37 shows a coaxial cable unit 700 as in FIG. 3, wherein the ends 16, 18 of the inner conductor 12 are connected across a capacitor $C_1$, to a radio frequency power source. The ends 20, 22 of the outer conductor 14 are connected across a capacitor $C_2$. The inductance of the inner and outer conductors 12, 14 and the values of the capacitors are adjusted so that the respective circuits are tuned to substantially the same frequency.

Figure 38:
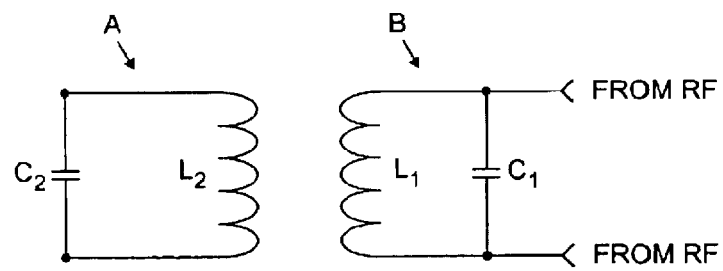
FIG. 38 is a schematic representation of the coaxial cable unit of FIG. 37.

FIG. 38 is a schematic representation of the coaxial cable unit of FIG. 37, where the inner conductor 12 is represented by the inductor $L_1$ and the outer conductor 14 is represented by $L_2$. In this case, a time varying voltage in the inner conductor 12 ($L_1$) induces a time-varying voltage in the outer conductor 14 ($L_1$), causing emission of radio frequency pulses from the outer conductor 14 ($L_1$). The first circuit A comprising the inductor $L_1$ and the capacitor $C_1$ filters the driving signal from the RF power source to within a first bandwidth. The second circuit B comprising the inductor $L_2$ and the capacitor $C_2$ filters the signal received from the first circuit A to within a narrower bandwidth. The signal transmitted by the circuit B therefore includes less noise than conventional transmitting antennas.

Any of the coaxial cable configurations discussed above can act as both a receiving and transmitting antenna.

Figure 39:
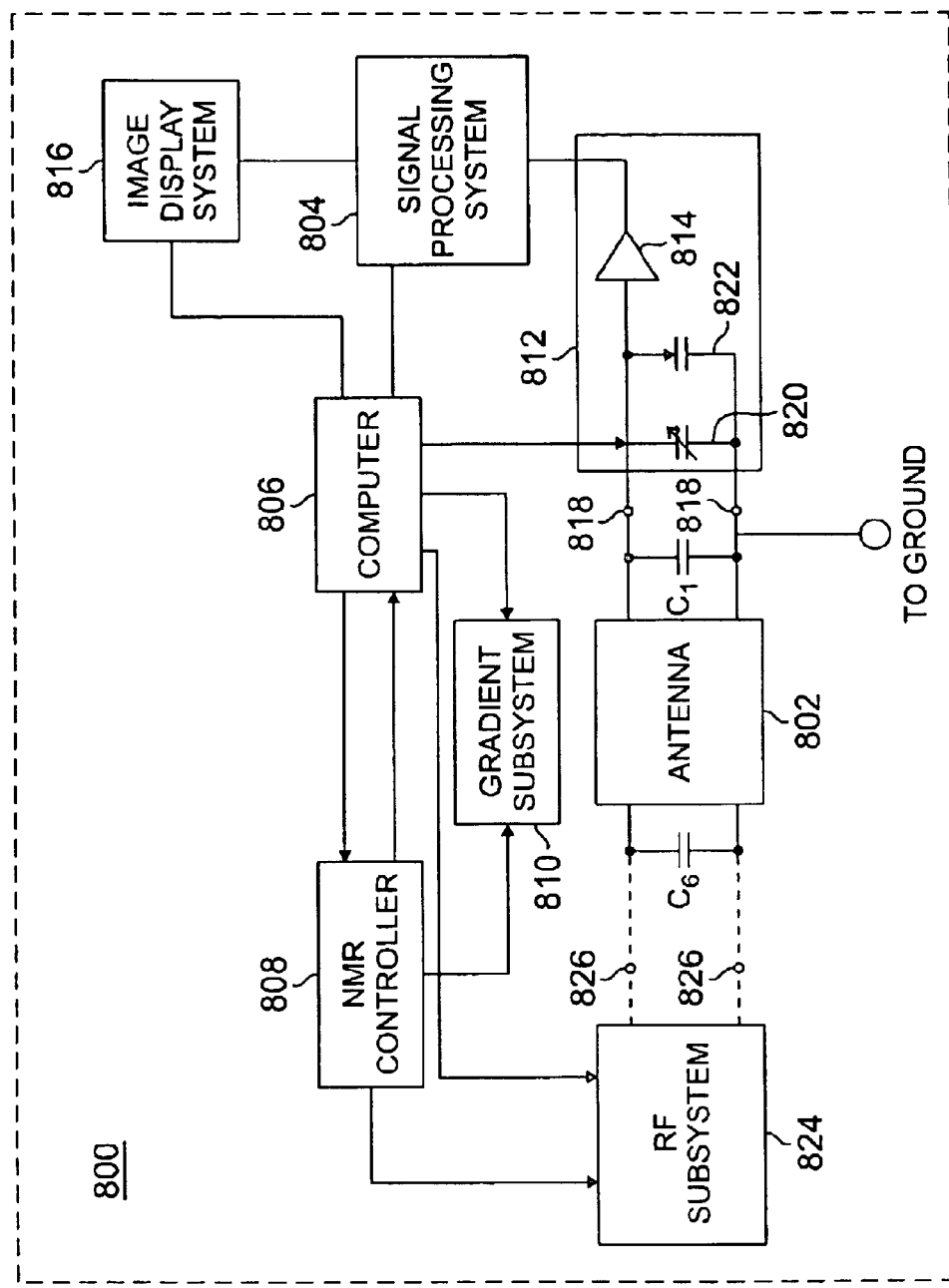
FIG. 39 is a schematic representation of portions of an MRI system, showing in particular a connection between an antenna or antenna array 802 in accordance with the present invention with certain components of the MRI system.

FIG. 39 is a schematic representation of portions of an MRI system 800, showing in particular a connection between an antenna or antenna array 802 in accordance with the present invention with certain components of the MRI system. A signal processing system 804, a computer 806, an NMR controller 808, a gradient coil subsystem 810, a receiver subsystem 812 including a preamplifier 116, and an image display system 114 of the MRI system 800 are also shown. The computer 806 controls the overall operation of the MRI system 800. The NMR controller 808 stores the timing of the scanning sequences and controls implementation of the scanning sequence. The signal processing system 804 typically includes a variable amplifier, a frequency down converter, an analog-to-digital converting array and a digital data processor (not shown), as is known in the art. The gradient coil subsystem 810 includes the gradient coils and a gradient waveform generator, which outputs particular waveforms for a desired scanning sequence to the gradient coils under the control of the NMR controller 808, also as is known in the art. The particular ends of the inner conductor of the coaxial cable unit providing the output of the antenna array 802 are connected to the receiver system 812 of the MRI system 800 through the port 818.

As discussed above, the presence of a patient provides a load on the antenna array 802 which lowers the antenna's Q. The presence of the patient also shifts the resonant frequency of the antenna array 802, which may require returning to the desired Larmor frequency. A varactor, or variable capacitor 820 is therefore provided between the capacitor $C_1$ of the antenna 802 and the preamplifier 816 parallel to the capacitor $C_1$, to enable returning of the antenna array 802 when the antenna array is positioned with respect to the patient, as is known in the art. Alternatively, $C_1$ may be the varactor 520. A back diode 822 is preferably provided parallel to the varactor 820 to prevent the passage of excessive voltage to the preamplifier 816, also as is known in the art. Voltage greater than about 0.7 volts is typically blocked by the back diode 822. The varactor 820 is controlled by the computer 806. The port 818 may be connected to the varactor 820, back diode 552 and preamplifier 810 through a short, low capacitance cable, or other appropriate means.

FIG. 39 also shows an optional connection between the capacitor $C_6$ and the antenna 802, and the RF transmitting subsystem 824 of the MRI system, through the optional port 826. The RF transmitting subsystem includes an RF power source (not shown) for driving the transmitting antenna, as is known in the art. The RF transmitting subsystem 824 can also be connected to the capacitor $C_1$ through a switch controlled by the computer 806. The computer 806 would switch the connection between the RF subsystem 824 and the antenna 802, and the preamplifier 820 and the antenna 802, at appropriate times. The RF transmitting subsystem 824 is controlled by the NMR controller 808 and the computer 806 of the MRI system 800.

A more complete description of the structure and operation of the MRI system may be found in U.S. Pat. No. 6,025,717, assigned to the assignee of the present invention and incorporated by reference, herein.

The above embodiments are examples of antennas and magnetic resonance imaging systems in accordance with the present invention. It will be recognized by those skilled in the art that changes may be introduced to those embodiments without going beyond the scope of the invention, which is defined by the claims, below.

We claim:

1. An MRI antenna, comprising:
    an inner conductor with first and second ends for being electrically connected across a capacitor to tune the inner conductor to a frequency, the first and second ends providing an output of the antenna; and
    an outer conductor substantially surrounding the inner conductor, the outer conductor having first and second ends for being electrically connected across a capacitor to tune the outer conductor to the frequency;
    wherein:
    the inner and outer conductors are inductively coupled during operation; and
    the inner and the outer conductors are electrically unconnected to each other.

2. The MRI antenna of claim 1, wherein the inductive coupling is tight or critical coupling.

3. The MRI antenna of claim 1, wherein the first and second ends of the outer conductor are electrically connected across a capacitor.

4. The MRI antenna of claim 3, wherein the first and second ends of the inner conductor are electrically connected across a capacitor.

5. The MRI antenna of claim 4, wherein the capacitor is a variable capacitor.

6. The MRI antenna of claim 5, wherein the variable capacitor is part of a receiver subsystem of an MRI system.

7. The MRI antenna of claim 1, wherein the inner and outer conductors comprise a first coaxial cable unit, the antenna further comprising a second coaxial cable unit comprising a second inner conductor and a second outer conductor substantially surrounding the second inner conductor, the second inner and outer conductors being inductively coupled during operation, wherein the second inner conductor is electrically connected to the first inner conductor, the second outer conductor is electrically connected to the second outer conductor and the first coaxial cable unit is inductively coupled to the second coaxial cable unit during operation.

8. The MRI antenna of claim 1, wherein:
    the inner conductor comprises a first section between the first end and a third end and a second section between the second end and a fourth end the third end and the fourth end being electrically connected across a capacitor; and
    the outer conductor comprises a first section between the first end and a third end and a second section between the second end and a fourth end, the third and fourth ends being electrically connected across a capacitor.

9. The MRI antenna of claim 8, further comprising a second coaxial cable unit adjacent to the first coaxial cable unit such that the first and second coaxial cable units are inductively coupled during operation, the second coaxial cable unit comprising a second inner conductor and a second outer conductor, each having first and second ends, respectively, wherein the second outer conductor substantially surrounds the second inner conductor and the first end of the inner conductor is electrically connected to the second end of the inner conductor across a capacitor and the first end of the outer conductor is connected to the second end of the outer conductor across a capacitor;
    the second inner conductor comprising a first section between the first end and a third end and a second section between the second end and a fourth end, the third end and the fourth end being electrically connected across a capacitor;
    the second outer conductor comprising a first section between the first end and a third end and a second section between the second end and a fourth end, the second and fourth ends being electrically connected across a capacitor.

10. The MRI antenna of claim 9, wherein the first and second coaxial cable units are tightly or critically coupled to each other.

11. The MRI antenna of claim 8, further comprising a support supporting the first and second sections in a same plane.

12. The MRI antenna of claim 1, wherein the first and second ends of the outer conductor are connected through a copper adaptor.

13. The MRI antenna of claim 1, wherein the first and second ends of the outer conductors are directed radially outward from the region for receiving a body part, parallel to each other, the first and second ends being connected along adjacent sides of the outer conductor, proximate the first and second ends.

14. The MRI antenna of claim 1, wherein the first inner conductor and the first outer conductor define a first coaxial cable unit, the antenna further comprising a second inner conductor and a second outer conductor substantially surrounding the second inner conductor, the second inner conductor and the second outer conductor being inductively coupled during operation, the second inner conductor and the second outer conductor defining a second coaxial cable unit, the first and second coaxial cable units being concentric and lying in substantially the same plane, the second coaxial cable unit being within a region defined by the first coaxial cable unit, the outer conductor of the first coaxial cable unit, and the outer conductor of the second coaxial cable unit each having first and second adjacent ends;

wherein the first end of the outer conductor of the first coaxial cable unit is directly electrically connected to the first end of the outer conductor of the second coaxial cable unit, the second end of the outer conductor of the first coaxial cable unit is directly electrically connected to the second end of the outer conductor of the second coaxial cable unit, and the first end of the first outer conductor is electrically connected to the second end of the first outer conductor through a capacitor, and a first end of the second inner conductor is directly electrically connected in series to a first end of the first inner conductor, a second end of the second inner conductor is directly electrically connected in series to the second end of the first inner conductor and the inner conductors are connected across a capacitor to provide an output of the antenna.

15. The MRI antenna of claim 1, further comprising a plurality of inner conductors within the outer conductor, the inner conductors being electrically connected to form a circuit tunable to the frequency.

16. The MRI antenna of claim 15, wherein certain of the inner conductors are connected in series and certain of the inner conductors are connected in parallel.

17. The MRI antenna of claim 15, further comprising a second outer conductor substantially surrounding the first outer conductor, the second outer conductor having first and second ends connected across a capacitor, the second outer conductor being tunable to the frequency and the second outer conductor defining a plurality of openings through the second outer conductor.

18. The MRI antenna of claim 1, further comprising a second outer conductor substantially surrounding the first outer conductor, the second outer conductor having first and second ends connected across a capacitor, the second outer conductor being tunable to the frequency and the second outer conductor defining a plurality of openings through the second outer conductor.

19. The MRI antenna of claim 1, further comprising:

a second inner conductor with first and second ends for being electrically connected across a capacitor to tune the inner conductor to the frequency;

a second outer conductor substantially surrounding the second inner conductor, the second outer conductor having first and second ends for being electrically connected across a capacitor to tune the second outer conductor to the frequency, the second inner conductor and the second outer conductors being inductively coupled during operation;

the first inner conductor and the first outer conductor defining a first coaxial cable unit lying in a first plane and the second inner conductor and the second outer conductors defining a second coaxial cable unit lying in a second plane perpendicular to the first plane, wherein the second inner conductor provides a second output of the antenna across the first and second ends of the second inner conductor.

20. An MRI antenna comprising:

first and second inductively coupled windings;

wherein the first and second windings are each tuned to the same frequency, the first winding substantially shields the second winding from direct reception of magnetic resonance signals, and the second winding provides an output of the antenna.

21. The MRI antenna of claim 20, wherein the first winding and the second winding each comprise at least one inductor and at least one capacitor electrically connected in series, wherein the at least one inductor of the first winding is inductively coupled to the at least one inductor of the second winding.

22. The MRI antenna of claim 20, wherein the inductive coupling is tight or critical coupling.

23. An MRI antenna, comprising:

a coaxial cable unit comprising:
an inner conductor with first and second ends and;
an outer conductor substantially surrounding the inner conductor;

wherein:
the outer conductor and the inner conductor are inductively coupled and tunable to the Larmor frequency of the species of interest during operation;
the inner and the outer conductors are electrically unconnected to each other; and
the inner conductor provides an output of the antenna.

24. The MRI antenna of claim 23, wherein the inner conductor comprises a plurality of inductors separated by capacitors, and the outer conductor comprises a plurality of inductors separated by capacitors.

25. The MRI antenna of claim 23, wherein each inductor of the inner conductor corresponds to an inductor of the outer conductor.

26. The MRI antenna of claim 23, wherein at least one of the inductors and capacitors of the inner conductor and at least one of the inductors and capacitors of the outer conductor are part of a respective coaxial cable unit, the antenna comprising a plurality of coaxial cable units.

27. The MRI antenna of claim 23, wherein the inductive coupling is tight or critical coupling.

28. An MRI antenna, comprising:

detecting means for directly detecting magnetic resonance signals emitted by a subject;

receiving means for inductively receiving signals corresponding to the detected magnetic resonance signals from the detecting means, and for providing received signals for analysis, wherein the receiving means is electrically unconnected to the detecting means; and means for shielding the receiving means from direct detection of the magnetic resonance signals means.

29. The MRI antenna of claim 28, wherein the detecting means and the shielding means are the same.

30. The MRI antenna of claim 28, further comprising filtering means for filtering the detected signals and the received signals.

31. An MRI antenna comprising:
a first inner conductor with first and second ends;
a first outer conductor with first and second ends, the first outer conductor substantially surrounding the first inner conductor to form a first coaxial cable unit, the first inner conductor and the first outer conductor being inductively coupled during operation;
a second inner conductor with first and second ends;
a second outer conductor with first and second ends, the second outer conductor substantially surrounding the second inner conductor to form a second coaxial cable unit, the second inner conductor and the second outer conductor being inductively coupled during operation;
wherein:
the inner conductors of the first and second coaxial cable units are electrically connected to form a first closed circuit tunable to a frequency;
the outer conductors of the first and second coaxial cable units are electrically connected to form a second closed circuit tunable to the same frequency;
the first closed circuit is electrically unconnected to the second closed circuit; and
the output of the antenna is provided from the first closed circuit comprising the inner conductors.

32. The MRI antenna of claim 31, wherein the inner conductors are electrically connected through at least one capacitor and the outer conductors are electrically connected through at least one capacitor.

33. The MRI antenna of claim 32, wherein the electrical connection is a series connection.

34. The MRI antenna of claim 31, further comprising:
a third inner conductor with first and second ends;
a third outer conductor with first and second ends, the third outer conductor substantially surrounding the third inner conductor to form a third coaxial cable unit defining a region for receiving a body part, the third inner conductor and the third outer conductor being inductively coupled during operation;
wherein the first closed circuit further comprises the third inner conductor of the third coaxial cable unit and the second closed circuit further comprises the third outer conductor of the third coaxial cable unit.

35. The MRI antenna of claim 34, wherein the first, second and third coaxial cable units lie in first, second and third respective parallel planes and are aligned with respect to an axis perpendicular to the first, second and third parallel planes.

36. The MRI antenna of claim 34, wherein the inner conductors are electrically connected through at least one capacitor and the outer conductors are electrically connected through at least one capacitor.

37. The MRI antenna of claim 36, wherein the electrical connection is a series connection.

38. The MRI antenna of claim 31, wherein:
at least one of the first and second coaxial cable units define a region to receive a body part.

39. An MRI antenna, comprising:
a first coaxial cable unit having a first outer conductor with first and second ends and a first inner conductor with first and second ends, respectively, wherein the first outer conductor substantially surrounds the first inner conductor, the first outer conductor and the first inner conductor being inductively coupled during operation;
the first coaxial cable unit defining a region for receiving a body part;

a second coaxial cable unit having a second outer conductor with first and second ends and a second inner conductor with first and second ends, wherein the second outer conductor substantially surrounds the second inner conductor, the second outer conductor and the second inner conductor being inductively coupled during operation, the second coaxial cable unit defining a region for receiving a body part;
a third coaxial cable unit having a third outer conductor with first and second ends and a third inner conductor with first and second ends, wherein the third outer conductor substantially surrounds the third inner conductor, the third outer conductor and the third inner conductor being inductively coupled during operation, the third coaxial cable unit defining a region for receiving a body part;
wherein:
the first end of the first inner conductor of the first coaxial cable unit is adapted to be connected to a receiver portion of an MRI device;
the second end of the first inner conductor of the first coaxial cable unit is electrically connected to the first end of the second inner conductor of the second coaxial cable unit through a capacitor;
the second end of the second inner conductor of the second coaxial cable unit is electrically connected in series to the first end of the third inner conductor of the third coaxial cable unit through a capacitor;
the second end of the third inner conductor of the third coaxial cable unit is adapted to be connected to a receiver portion of an MRI system;
the first end of the first outer conductor of the first coaxial cable unit is electrically connected to the first end of the second outer conductor of the second coaxial cable across a capacitor;
the second end of the second outer conductor of the second coaxial cable unit is electrically connected in series to the first end of the third outer conductor of the third coaxial cable through a capacitor; and
a second end of the third outer conductor of the third coaxial cable is electrically connected in series to a second end of the first outer conductor of the first coaxial cable;
wherein the circuit comprising the inner conductors and the circuit comprising the outer conductors are tunable to the same frequency.

40. The MRI antenna of claim 39, wherein the first, second and third coaxial cables lie in first, second and third parallel planes, respectively.

41. The MRI antenna of claim 40, wherein the first, second and third coaxial cables are aligned along an axis perpendicular to the first, second and third parallel planes.

42. The MRI antenna of claim 39, wherein the first and second coaxial cable units are inductively coupled and the second and third coaxial cable units are inductively coupled.

43. An MR antenna, comprising:
a support;
first and second coaxial cable units supported by the support in a first plane to define a region for receiving a body part, each coaxial cable unit comprising an inner conductor and an outer conductor substantially surrounding the inner conductor, the inner and outer conductors each comprising first and second ends and being inductively coupled during operation;
wherein the inner conductors of the first and second coaxial cable units are electrically connected to form, at least in part, a circuit tunable to a frequency and the outer conductors of the first and second coaxial cable units are electrically connected to the outer conductors of the second coaxial cable unit to form a second circuit tunable to the frequency.

44. The MRI antenna of claim 43, wherein the inner conductors and the outer conductors are electrically connected through capacitors.

45. The MRI antenna of claim 44, wherein the electrical connections are series connections.

46. The MRI antenna of claim 43, further comprising:
third and fourth coaxial cable units supported by the support adjacent to the first and second coaxial cable units in a second plane;
fifth and sixth coaxial cable units supported by the support adjacent to the first and second coaxial cable units in a third plane, the third plane being on an opposite side of the first and second coaxial cable units as the second plane;
wherein the inner and outer conductors of the third, fourth, fifth and sixth coaxial cable units are electrically connected to form a single circuit tunable to the frequency.

47. The MRI antenna of claim 46, wherein the inner conductors and the outer conductors are electrically connected through capacitors.

48. The MRI antenna of claim 47, wherein the electrical connections are series connections.

49. The MRI antenna of claim 47, wherein the electrical connections are series connections.

50. The MRI antenna of claim 46, further comprising:
seventh and eighth coaxial cable units supported by the support in a fourth plane between the first plane and the third plane to define a region for receiving the body part, the seventh and eight coaxial cable units each comprising an inner conductor and an outer conductor substantially surrounding the inner conductor, the inner and outer conductors each having first and second ends, respectively, and being inductively coupled during operation;
wherein the inner conductors of the seventh and eighth coaxial cable units are electrically connected to form a circuit tunable to the frequency, and the outer conductors of the seventh and eighth coaxial cable units are electrically connected to form a circuit tunable to the frequency.

51. The MRI antenna of claim 50, wherein the inner conductors and the outer conductors are electrically connected through capacitors.

52. The MRI antenna of claim 50, wherein the first, second, third and fourth planes are parallel to each other.

53. The MRI antenna of claim 52, wherein the first and second, third and fourth, fifth and sixth, and seventh and eighth coaxial cables are aligned with respect to an axis perpendicular to the first, second, third and fourth planes.

54. The MRI antenna of claim 50, wherein adjacent pairs of coaxial cable units are inductively coupled.

55. The MRI antenna of claim 50, wherein the seventh and eighth coaxial cable units have a diameter less than a diameter of the first and second, third and fourth, and fifth and sixth coaxial cable units.

56. An MRI antenna, comprising:
a support;
first and second coaxial cable units supported by the support in a first plane to define a region for receiving a body part, each coaxial cable unit comprising an inner conductor and an outer conductor substantially surrounding the inner conductor, the inner and outer conductors each comprising first and second ends and being inductively coupled during operation;
wherein:
the first end of the inner conductor of the first coaxial cable unit is electrically connected to the first end of the inner conductor of the second coaxial cable unit across a first capacitor and the second end of the inner conductor of the first coaxial cable unit is connectable to the second end of the inner conductor of the second coaxial cable unit across a second capacitor to tune the inner conductors to a frequency, the output of the antenna being provided across the second capacitor; and
the first end of the outer conductor of the first coaxial cable unit is electrically connected to the first end of the outer conductor of the second coaxial cable unit across a capacitor and the second end of the outer conductor of the first coaxial cable unit is electrically connected to the second end of the outer conductor of the second coaxial cable unit across a capacitor, for tuning the outer conductor to the frequency.

57. The MRI antenna of claim 56, further comprising third and fourth coaxial cable units supported by the support adjacent to the first and second coaxial cable units in a second plane; and
fifth and sixth coaxial cable units supported by the support adjacent to the first and second coaxial cable units in a third plane, the third plane being on an opposite side of the first and second coaxial cable units as the second plane;
wherein a first end of an inner conductor of the third coaxial cable unit is electrically connected to a first end of the inner conductor of the fourth coaxial cable unit across a capacitor, a second end of an inner conductor of the third coaxial cable unit is electrically connected to a first end of an outer conductor of the sixth coaxial cable unit across a capacitor and a second end of the inner conductor of the fourth coaxial cable unit is electrically connected to a second end of the outer conductor of the third coaxial cable unit,
a second end of an inner conductor of the fifth coaxial cable unit is electrically connected to a second end of an inner conductor of the sixth coaxial cable unit through a capacitor and a second end of an outer conductor of the fifth coaxial cable unit is electrically connected to a second end of the outer conductor of the sixth coaxial cable unit across a capacitor, and the circuit comprising the inner and outer conductors of the third, fourth, fifth and sixth coaxial cable units is tuned to the frequency, and
a first end of an inner conductor of the fifth coaxial cable unit is electrically connected to a second end of the outer conductor of the fourth coaxial cable unit.

58. The MRI antenna of claim 57, further comprising:
seventh and eight coaxial cable units supported by the support in a fourth plane between the first plane and the third plane to define a region for receiving the body part, the seventh and eight coaxial cable units each comprising an inner conductor and an outer conductor substantially surrounding the inner conductor, the inner and outer conductors each having first and second ends, respectively, and being inductively coupled during operation;
wherein the first end of the inner conductor of the seventh coaxial cable unit is electrically connected to the first end of the inner conductor of the eight coaxial cable unit across a capacitor and the second end of the inner conductor of the seventh coaxial cable unit is electrically connected to the second end of the inner conductor of the eight coaxial cable unit across a capacitor, to tune the inner conductors to the frequency, and the first end of the outer conductor of the seventh coaxial cable unit is electrically connected to the first end of the outer conductor of the eight coaxial cable unit through a capacitor and the second end of the outer conductor of the seventh coaxial cable unit is electrically connected to the second end of the outer conductor of the eight coaxial cable unit through a capacitor, to tune the outer conductors to the same frequency.

59. The MRI antenna of claim 58, wherein the first, second, third and fourth planes are parallel to each other.

60. The MRI antenna of claim 58, wherein the first and second, third and fourth, fifth and sixth, and seventh and eighth coaxial cables are aligned with respect to an axis perpendicular to the first, second, third and fourth planes.

61. The MRI antenna of claim 58, wherein adjacent pairs of coaxial cable units are inductively coupled.

62. The MRI antenna of claim 58, wherein the seventh and eighth coaxial cable units have a diameter less than a diameter of the first and second, third and fourth, and fifth and sixth coaxial cable units.

63. An MRI antenna comprising:
a first inner conductor with first and second ends;
a first outer conductor substantially surrounding the first inner conductor;
the first inner conductor and the first outer conductor being inductively coupled during operation, and defining a first coaxial cable unit;
a second inner conductor and a second outer conductor substantially surrounding the second inner conductor, the second inner conductor and the second outer conductor being inductively coupled during operation, and defining a second coaxial cable unit;
wherein:
the first and second coaxial cable units are concentric and lie substantially in the same plane, the second coaxial cable unit being within a region defined by the first coaxial cable unit;
the first outer conductor and the second outer conductor each have first and second adjacent ends, the first end of the first outer conductor being directly connected to the first end of the second outer conductor, the second end of the first outer conductor being directly connected to the second end of the second outer conductor, and the first end of the first outer conductor being electrically connectable to the second end of the first outer conductor across a capacitor to tune the outer conductors to a frequency;
a first end of the first inner conductor is directly electrically connected in series to a first end of the second inner conductor and a second end of the first inner conductor is directly electrically connected in series to the second end of the second inner conductor; and
the first and second ends of the second inner conductor are electrically connectable across a capacitor to tune the inner conductors to the frequency and to provide an output of the antenna.

64. The antenna of claim 63, wherein:
the inner and outer conductors of the first coaxial cable unit are electrically unconnected; and the inner and outer conductors of the second coaxial cable unit are electrically unconnected.

65. The MRI antenna of claim 64, wherein:
the inner conductor comprises a plurality of inner conductor segments, wherein adjacent inner conductor segments are electrically connected across a capacitor; and
the outer conductor comprises a plurality of outer conductor segments, wherein adjacent outer conductor segments are electrically connected across a capacitor.

66. An MRI antenna comprising:
an outer conductor with first and second ends for being electrically connected across a capacitor to tune the outer conductor to a frequency; and
a plurality of inner conductors substantially surrounded by the outer conductor, the inner conductors being connectable across at least one capacitor to tune the inner conductors to the frequency, the outer conductor and the inner conductors being inductively coupled during operation;
wherein an output of the antenna is provided from the inner conductors.

67. The MRI antenna of claim 66, wherein certain of the inner conductors are connected in series and certain of the inner conductors are connected in parallel.

68. The MRI antenna of claim 66, wherein the inner conductors are connected in parallel.

69. The MRI antenna of claim 66, further comprising multiple coaxial cable units each comprising an outer conductor and a plurality of inner conductors, wherein the outer conductors are electrically connected across a capacitor to form a first circuit tunable to the frequency and the inner conductors are electrically connected to form a second circuit tunable to the frequency.

70. The MRI antenna of claim 69, wherein the outer conductors are connected in parallel.

71. The MRI antenna of claim 69, comprising three coaxial cable units, each unit comprising four inner conductors;
wherein
the two inner conductors of a first unit are electrically connected in series through a capacitor and two inner conductors are electrically connected in parallel, the series connected conductors being electrically connected to the parallel connected conductors through a second capacitor;
a first two inner conductors of the second unit are electrically connected in parallel and a second two inner conductors of the second unit are electrically connected in parallel, the first two and second two parallel connected inner conductors being electrically connected through a third capacitor, and the parallel connected inner conductors of the first unit being electrically connected to the first two parallel connected inner conductors of the second unit through a fourth capacitor;
three inner conductors of the third unit being electrically connected in parallel to a fourth inner conductor of the third unit through a fifth capacitor, the fourth inner conductor being electrically connected in parallel to the second two parallel connected inner conductors of the second unit and to the third capacitor; and
one inner conductor of the series connected inner conductors of the first unit and one parallel connected inductor of the fourth unit being connectable across a capacitor to provide an output of the antenna.

72. The MRI antenna of claim 66, further comprising:
a second outer conductor substantially surrounding the first outer conductor, the second outer conductor defining a plurality of holes through the second outer conductor,
the second outer conductor having first and second ends electrically connected across a capacitor to tune the second outer conductor to the frequency;
the second outer conductor and the first outer conductor being inductively coupled during operation.

73. The MRI antenna of claim 66, comprising four inner conductors, wherein in the circuit, two of the inner conductors are electrically connected in series through a capacitor and two of the inner conductors are electrically connected in parallel, the series connected inductors and the parallel connected inductors being electrically connected to each other through a capacitor.

74. The antenna of claim 66, wherein the plurality of inner conductors are electrically unconnected to the outer conductor.

75. An MRI antenna, comprising:
an inner conductor with first and second ends electrically connectable across a capacitor to tune the inner conductor to a frequency, the first and second ends providing an output of the antenna;
a first outer conductor substantially surrounding the inner conductor, the first outer conductor having first and second ends being electrically connected across a capacitor to tune the first outer conductor to the frequency;
a second outer conductor substantially surrounding the first outer conductor, the second outer conductor having first and second ends electrically connected across a capacitor to tune the second outer conductor to the frequency, the second outer conductors each defining a plurality of holes there through; and
the inner conductor being inductively coupled to the first outer conductor and the first and second outer conductors being inductively coupled, during operation.

76. The antenna of claim 75, wherein:
the inner conductor is electrically unconnected to the first outer conductor and to the second outer conductor.

77. A magnetic resonance imaging system comprising:
a receiver system; and
an antenna connected to the receiver system, the antenna comprising:
a support;
first and second coaxial cable units supported by the support in a first plane to define a region for receiving a body part, each coaxial cable unit comprising an inner conductor and an outer conductor substantially surrounding the inner conductor, the inner and outer conductors each comprising first and second ends;
wherein the first end of the inner conductor of the first coaxial cable unit is electrically connected to the first end of the inner conductor of the second coaxial cable unit across a first capacitor and the second end of the inner conductor of the first coaxial cable unit is electrically connected to the second end of the inner conductor across a second capacitor to tune the inner conductors to a frequency, and
the first end of the outer conductor of the first coaxial cable unit is electrically connected to the first end of the outer conductor of the second coaxial cable unit across a capacitor and the second end of the outer conductor of the first coaxial cable unit is electrically connected to the second end of the outer conductor of the second coaxial cable unit across a capacitor to tune the outer conductors to the same frequency as the inner conductors, and
the antenna is connected to the receiver system across the second capacitor.

78. An magnetic resonance imaging system comprising:
a receiver subsystem; and
an antenna connected to the receiver subsystem, the antenna comprising:
an inner conductor with first and second ends electrically connected across a capacitor to tune the inner conductor to a frequency, the first and second ends being connected to the receiver subsystem; and
an outer conductor substantially surrounding the inner conductor, the outer conductor having first and second ends electrically connected across a capacitor to tune the outer conductor to the same frequency as the inner conductor;
the inner and outer conductors defining a region for receiving a body part.

79. The magnetic resonance imaging system of claim 78, comprising a plurality of inner conductors, electrically connected to form a circuit tuned to the frequency.

80. The magnetic resonance imaging system of claim 79, further comprising a second outer conductor surrounding the first outer conductor, the second outer conductor having first and second ends electrically connected across a capacitor to tune the second outer conductor to the frequency, the second outer conductor defining a plurality of holes through the conductor.

81. A magnetic resonance imaging system comprising:
a receiver subsystem; and
an antenna connected to the receiver subsystem, the antenna comprising:
a first coaxial cable having a first outer conductor with first and second ends and a first inner conductor with first and second ends, respectively, wherein the first outer conductor substantially surrounds the first inner conductor, the coaxial cable unit defining a region for receiving a body part;
a second coaxial cable unit having a second outer conductor with first and second ends and a second inner conductor with first and second ends, wherein the second outer conductor substantially surrounds the second inner conductor, the second coaxial cable unit defining a region for receiving a body part;
a third coaxial cable unit having a third outer conductor with first and second ends and a third inner conductor with first and second ends, wherein the third outer conductor substantially surrounds the third inner conductor, the third coaxial cable defining a region for receiving a body part;
wherein:
the first end of the first inner conductor of the first coaxial cable unit is connected to a receiver subsystem;
the second end of the first inner conductor of the first coaxial cable unit is electrically connected to the first end of the second inner conductor of the second coaxial cable through a capacitor;
the second end of the second inner conductor of the second coaxial cable unit is electrically connected in series to the first end of the third inner conductor of the third coaxial cable unit through a capacitor;

the second end of the third inner conductor of the third coaxial cable unit is connected to the receiver subsystem;

the first end of the first outer conductor of the first coaxial cable is electrically connected to the first end of the second outer conductor of the second coaxial cable across a capacitor;

the second end of the second outer conductor of the second coaxial cable is electrically connected in series to the first end of the third outer conductor of the third coaxial cable through a capacitor; and a second end of the third outer conductor of the third coaxial cable is electrically connected in series to a second end of the first outer conductor of the first coaxial cable;

wherein the circuits comprising the inner conductors and the circuits comprising the outer conductors are tuned to the same frequency.

82. A magnetic resonance imaging system, comprising:
a receiver system; and
an antenna coupled to the receiver system, the antenna comprising:
   a first inner conductor with first and second ends;
   a first outer conductor substantially surrounding the first inner conductor;
   the first inner conductor and the first outer conductor defining a first coaxial cable unit defining a region for receiving a body part;
   a second inner conductor and a second outer conductor substantially surrounding the second inner conductor, the second inner conductor and the second outer conductor being inductively coupled during operation, and defining a second coaxial cable unit;
wherein:
   the first and second coaxial cable units are concentric and lie in substantially in the same plane, the second coaxial cable unit being within a region defined by the first coaxial cable unit;
   a second inner conductor and a second outer conductor substantially surrounding the second inner conductor, the second inner conductor and the second outer conductor being inductively coupled during operation, and defining a second coaxial cable unit;
wherein:
   the first and second coaxial cable units are concentric and lie in substantially in the same plane, the second coaxial cable unit being within a region defined by the first coaxial cable unit;
   the first outer conductor and the second outer conductor each have first and second adjacent ends, the first end of the first outer conductor being directly connected to the first end of the second outer conductor, the second end of the first outer conductor being directly connected to the second end of the second outer conductor, and the first end of the first outer;
   a first end of the first inner conductor is directly electrically connected in series to a first end of the second inner conductor and a second end of the first inner conductor is directly electrically connected in series to the second end of the second inner conductor; and
   the first and second ends of the second inner conductor are electrically connectable across a capacitor to tune the inner conductors to the frequency and to provide an output of the antenna.

83. A magnetic resonance imaging system, comprising:
a receiver system; and
an antenna connected to the receiver system, the antenna comprising:
   an inner conductor with first and second ends electrically connectable across a capacitor to tune the inner conductor to a frequency, the first and second ends providing an output of the antenna;
   a first outer conductor substantially surrounding the inner conductor, the first outer conductor having first and second ends electrically connected across a capacitor to tune the first outer conductor to the frequency of the inner conductor;
   a second outer conductor substantially surrounding the first outer conductor, the second outer conductor having first and second ends electrically connected across a capacitor to tune the second outer conductor to the frequency, the second outer conductor defining a plurality of holes therethrough; and
   the inner and outer conductors defining a region for receiving a body part and being inductively coupled during operation.

84. A method of detecting magnetic resonance signals emitted by a subject for processing by a magnetic resonance imaging system by an antenna comprising first and second inductively coupled conductors, the method comprising:
   tuning the first and second conductors to a frequency;
   detecting the magnetic resonance signals by the first conductor while shielding the second conductor from direct detection of the magnetic resonance signals;
   inducing signals in the second conductor corresponding to the magnetic resonance signals detected by the first conductor; and
   providing signals from the second conductor to the magnetic resonance system for analysis.

85. The method of claim 84, further comprising filtering the detected and induced signals.

86. The method of claim 84, wherein the first conductor substantially surrounds the second conductor, thereby substantially shielding the second conductor.

87. The method of claim 84, further comprising providing a coaxial cable unit defined by the first and second conductors, proximate a portion of the subject.

88. The method of claim 87, wherein the coaxial cable is shaped to define a region for receiving a portion of the subject, the method further comprising positioning the coaxial cable unit around the portion of the subject.

89. The method of claim 88, further comprising positioning a plurality of coaxial cable units around the portion of the patient, wherein each coaxial cable unit is inductively coupled to an adjacent coaxial cable unit, the inner conductors of each of the coaxial cable units are electrically connected to form a circuit tuned to the frequency, and the outer conductors of each of the coaxial cable units are electrically connected to form a circuit tuned to the frequency.

90. An MRI transmitting antenna, comprising:
   an inner conductor with first and second ends for being electrically connected across a capacitor to tune the inner conductor to a frequency, the first and second ends for receiving an input; and
   an outer conductor substantially surrounding the inner conductor, the outer conductor having first and second ends for being electrically connected across a capacitor to tune the outer conductor to the frequency;
   the inner and outer conductors defining a region for receiving a body part and being inductively coupled during operation.

91. A magnetic resonance imaging system, comprising:
a radio frequency transmitting system; and
an antenna comprising:
- an inner conductor with first and second ends electrically connected across a capacitor to tune the inner conductor to a frequency, the first and second ends being connected to the radio frequency transmitting system; and
- an outer conductor substantially surrounding the inner conductor, the outer conductor having first and second ends for being electrically connected across a capacitor to tune the outer conductor to the frequency;
the inner and outer conductors defining a region for receiving a body part and being inductively coupled during operation.

92. An MRI antenna, comprising:

detecting means for directly detecting magnetic resonance signals emitted by a subject; and receiving means for inductively receiving signals corresponding to the detected magnetic resonance signals from the detecting means, and for providing received signals for analysis;

wherein the detecting means shields the receiving means from direct detection of the magnetic resonance signals means.

93. The MRI antenna of claim 92, further comprising filtering means for filtering the detected signals and the received signals.

94. An MRI antenna, comprising:

an inner conductor with first and second ends for being electrically connected across a capacitor to tune the inner conductor to a frequency, the first and second ends providing an output of the antenna; and an outer conductor encasing the inner conductor, the outer conductor having first and second ends for being electrically connected across a capacitor to tune the outer conductor to the frequency;

wherein:
- the inner and outer conductors are inductively coupled during operation; and
- the inner and the outer conductors are electrically unconnected to each other.

* * * * *